US011450328B2

(12) United States Patent
Buethe et al.

(10) Patent No.: US 11,450,328 B2
(45) Date of Patent: Sep. 20, 2022

(54) APPARATUS AND METHOD FOR ENCODING OR DECODING A MULTICHANNEL SIGNAL USING A SIDE GAIN AND A RESIDUAL GAIN

(71) Applicant: FRAUNHOFER-GESELLSCHAFT ZUR FOERDERUNG DER ANGEWANDTEN FORSCHUNG E.V., Munich (DE)

(72) Inventors: Jan Buethe, Erlangen (DE); Guillaume Fuchs, Bubenreuth (DE); Wolfgang Jaegers, Erlangen (DE); Franz Reutelhuber, Erlangen (DE); Juergen Herre, Erlangen (DE); Eleni Fotopoulou, Nuremberg (DE); Markus Multrus, Nuremberg (DE); Srikanth Korse, Nuremberg (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 197 days.

(21) Appl. No.: 16/405,422

(22) Filed: May 7, 2019

(65) Prior Publication Data

US 2019/0259398 A1 Aug. 22, 2019

Related U.S. Application Data

(63) Continuation of application No. PCT/EP2017/077822, filed on Oct. 30, 2017.

(30) Foreign Application Priority Data

Nov. 8, 2016 (EP) .................................... 16197816

(51) Int. Cl.
*G10L 19/008* (2013.01)
*H04S 3/00* (2006.01)
(Continued)

(52) U.S. Cl.
CPC ............ *G10L 19/008* (2013.01); *H04S 1/007* (2013.01); *H04S 3/008* (2013.01); *H04S 7/30* (2013.01);
(Continued)

(58) Field of Classification Search
CPC ... G10L 19/008; G10L 19/02; G10L 19/0204; G10L 19/0208; H04S 3/008; H04S 3/02;
(Continued)

(56) References Cited

U.S. PATENT DOCUMENTS 6,161,089 A * 12/2000 Hardwick .............. G10L 19/02 704/219
6,226,616 B1 5/2001 You et al.
(Continued)

FOREIGN PATENT DOCUMENTS

EP 3 067 889 A1 9/2016
JP 2008020931 A 1/2008
(Continued)

OTHER PUBLICATIONS

From Joint Stereo to Spatial Audio Coding—Recent Progress and Standardization, Proc. of the 7th Int. Conference on digital Audio Effects (DAFX-04), Naples, Italy, Oct. 5-8, 2004.
(Continued)

*Primary Examiner* — Leshui Zhang
(74) *Attorney, Agent, or Firm* — Perry + Currier Inc.

(57) ABSTRACT

An apparatus for encoding a multi-channel signal having at least two channels, has: a downmixer for calculating a downmix signal from the multi-channel signal; a parameter calculator for calculating a side gain from a first channel of
(Continued)

the at least two channels and a second channel of the at least two channels and for calculating a residual gain from the first channel and the second channel; and an output interface for generating an output signal, the output signal having information on the downmix signal, and on the side gain and the residual gain.

18 Claims, 16 Drawing Sheets

(51) Int. Cl.
*H04S 1/00* (2006.01)
*H04S 7/00* (2006.01)
*H03M 7/30* (2006.01)
*H04S 3/02* (2006.01)

(52) U.S. Cl.
CPC ....... *H04S 2400/01* (2013.01); *H04S 2420/03* (2013.01)

(58) Field of Classification Search
CPC ... H04S 1/007; H04S 7/00; H04S 7/30; H04S 7/301; H04S 7/302; H04S 7/303; H04S 7/304; H04S 7/305; H04S 7/306; H04S 7/307; H04S 7/308; H04S 2400/00; H04S 2400/01; H04S 2400/03; H04S 2420/03
USPC ................................ 704/500–504; 381/1–23
See application file for complete search history.

(56) References Cited

U.S. PATENT DOCUMENTS

| | | | |
|---|---|---|---|
| 6,611,212 B1 | 8/2003 | Craven et al. | |
| 7,573,912 B2 | 8/2009 | Lindblom | |
| 7,613,306 B2 | 11/2009 | Miyasaka et al. | |
| 8,036,904 B2 | 10/2011 | Myburg et al. | |
| 8,811,621 B2 | 8/2014 | Schuijers | |
| 8,817,991 B2 | 8/2014 | Jaillet et al. | |
| 8,964,994 B2 | 2/2015 | Jaillet et al. | |
| 9,191,045 B2 | 11/2015 | Purnhagen et al. | |
| 9,269,361 B2 | 2/2016 | Ragot et al. | |
| 9,398,294 B2 | 7/2016 | Robillard et al. | |
| 9,672,837 B2 | 6/2017 | Purnhagen et al. | |
| 2005/0105598 A1 | 5/2005 | Kaewell | |
| 2005/0254446 A1 | 11/2005 | Breebaart | |
| 2006/0165184 A1 | 7/2006 | Purnhagen et al. | |
| 2006/0190247 A1* | 8/2006 | Lindblom | G10L 19/008 704/230 |
| 2007/0063877 A1 | 3/2007 | Shmunk et al. | |
| 2007/0140499 A1 | 6/2007 | Davis | |
| 2007/0162278 A1 | 7/2007 | Miyasaka et al. | |
| 2007/0258607 A1 | 11/2007 | Purnhagen et al. | |
| 2008/0019539 A1 | 8/2008 | Myburg et al. | |
| 2008/0195397 A1 | 8/2008 | Myburg et al. | |
| 2008/0253576 A1* | 10/2008 | Choo | G10L 19/008 381/10 |
| 2009/0043591 A1 | 2/2009 | Breebaart et al. | |
| 2009/0222272 A1 | 9/2009 | Seefeldt et al. | |
| 2009/0325524 A1 | 12/2009 | Oh et al. | |
| 2010/0246832 A1 | 9/2010 | Villemoes et al. | |
| 2011/0096932 A1 | 4/2011 | Schuijers | |
| 2011/0255588 A1 | 10/2011 | Shim et al. | |
| 2011/0255714 A1 | 10/2011 | Neusinger et al. | |
| 2012/0002818 A1 | 1/2012 | Heiko et al. | |
| 2012/0224702 A1 | 9/2012 | Den Brinker et al. | |
| 2013/0030819 A1 | 1/2013 | Purnhagen et al. | |
| 2013/0121411 A1 | 5/2013 | Robillard et al. | |
| 2013/0262130 A1 | 10/2013 | Ragot et al. | |
| 2014/0222441 A1 | 8/2014 | Kuntz et al. | |
| 2016/0104491 A1* | 4/2016 | Lee | H04S 3/008 381/22 |
| 2016/0133262 A1 | 5/2016 | Fueg et al. | |

FOREIGN PATENT DOCUMENTS

| | | | |
|---|---|---|---|
| JP | 2008530616 | A | 8/2008 |
| JP | 2011522472 | A | 7/2011 |
| JP | 2012512438 | A | 5/2012 |
| JP | 2013511062 | A | 3/2013 |
| JP | 2013528824 | A | 7/2013 |
| JP | 2013546013 | A | 12/2013 |
| JP | 2014535182 | A | 12/2014 |
| JP | 2016531327 | A | 10/2016 |
| KR | 20070001162 | A | 1/2007 |
| KR | 20160033776 | A | 3/2016 |
| RU | 2402160 | C2 | 7/2009 |
| RU | 2369982 | C2 | 10/2009 |
| RU | 2425040 | C1 | 7/2011 |
| RU | 2443075 | C2 | 2/2012 |
| RU | 2554844 | C2 | 4/2014 |
| RU | 2577195 | C2 | 5/2014 |
| RU | 2560790 | C2 | 8/2015 |
| WO | WO-2010097748 | A1 | 9/2010 |
| WO | WO-2011024616 | A1 | 3/2011 |
| WO | WO-2017125558 | A1 | 7/2017 |
| WO | WO-2017125559 | A1 | 7/2017 |
| WO | WO-2017125562 | A1 | 7/2017 |
| WO | WO-2017125563 | A1 | 7/2017 |

OTHER PUBLICATIONS

Rupto, Official Action with English Translation, dated Dec. 27, 2019 re Russian Patent Application No. 2019117764/08(033957).
Rupto, Official Action with English Translation, dated Dec. 26, 2019 re Russian Patent Application No. 2019117749/08(033935).
Samsudin, E. K., et al. "A Stereo to Mono Dowmixing Scheme for MPEG-4 Parametric Stereo Encoder." 2006 IEEE International Conference on Acoustics Speech and Signal Processing Proceedings. vol. 5. IEEE, 2006.
Herre, Jürgen. "From joint stereo to spatial audio coding-recent progress and standardization." Sixth International Conference on Digital Audio Effects (DAFX04), Naples, Italy. 2004.
CIPO, Examination Report, dated Apr. 7, 2020, re Canadian Patent Application No. 3045948.
CIPO, Examination Report, dated Mar. 9, 2020 re Canadian Patent Application No. 3042580.
Fatus, Bertrand. "Parametric Coding for Spatial Audio." Master's Thesis, KTH, Stockholm, Sweden. 2015.
Herre, Jürgen, et al. "MPEG surround-the ISO/MPEG standard for efficient and compatible multichannel audio coding." Journal of the Audio Engineering Society 56.11 (2008): 932-955.
Kim, JungHoe et al. "Enhanced stereo coding with phase parameters for MPEG unified speech and audio coding." Audio Engineering Society Convention 127. Audio Engineering Society, 2009.
International Search Report and Written Opinion, dated Dec. 20, 2018, re PCT International Patent Application No. PCT/EP2017/077822.
Herre, J. and M. Dietz, "MPEG-4 high-efficiency AAC coding [Standards in a Nutshell]," in IEEE Signal Processing Magazine, vol. 25, No. 3, pp. 137-142, May 2008. URL: http://ieeexplore.ieee.org/stamp/stamp.jsp?tp=&arnumber=4490211&isnumber=4490183.
TIPO, Office Action, dated Oct. 8, 2018, re Taiwanese Patent Application No. 106138472.
WIPO/IB, International Preliminry Report on Patentability, dated Nov. 15, 2018, re International Patent Application No. PCT/EP2017/077824.
WIPO/IB, International Search Report and Written Opinion, dated Dec. 21, 2017, re PCT International Patent Application No. PCT/EP2017/077824.
Meltzer, Stefan, and Gerald Moser, "Mpeg-4 he-aac v2—audio coding for today's digital media world," EBU technical Review 305 (2006): 37-38.
Kurniawati, E., et al. "A stereo to mono dowmixing scheme for MPEG-4 parametric stereo encoder," 2006 IEEE International Conference on Acoustics Speech and Signal Processing Proceedings. vol. 5, IEEE, 2006.

(56) References Cited

OTHER PUBLICATIONS

Zhang, Shuhua et al., "Maximal Coherence Rotation for stereo coding." 2010 IEEE International Conference on Multimedia and Expo. IEEE, pp. 1097-11101, 2010.

ISO/IEC DIS 23008-3: 2015(E). Information technology—High efficiency coding and media delivery in heterogeneous environments—Part 3: 3D audio. ISO/IEC JTC 1/SC 29/WG 11. Feb. 20, 2015.

U.S. Appl. No. 16/402,883, Apparatus and Method for Downmixing or Upmixing a Multichannel Signal Using Phase Compensation, filed May 3, 2019.

* cited by examiner

APPARATUS AND METHOD FOR ENCODING OR DECODING A MULTICHANNEL SIGNAL USING A SIDE GAIN AND A RESIDUAL GAIN

CROSS-REFERENCE TO RELATED APPLICATIONS

This application is a continuation of copending International Application No. PCT/EP2017/077822, filed Oct. 30, 2017, which is incorporated herein by reference in its entirety, and additionally claims priority from European Application No. 16197816.8, filed Nov. 8, 2016, which is also incorporated herein by reference in its entirety.

BACKGROUND OF THE INVENTION

The present invention relates to the field of audio encoding and, particularly, to the field of stereo or multichannel encoding/decoding.

The state of the art methods for lossy parametric encoding of stereo signals at low bitrates are based on parametric stereo as standardized in MPEG-4 Part 3. The general idea is to reduce the number of channels by computing a downmix signal from two input channels after extracting stereo parameters which are sent as side information to the decoder. These stereo parameters are usually inter-channel-level-difference ILD, inter-channel-phase-difference IPD, and inter-channel-coherence ICC, which are calculated in subbands and which capture the spatial image to a certain extent.

The decoder performs an upmix of the mono input, creating two channels satisfying the ILD, IPD and ICC relations. This is done by matrixing the input signal together with a decorrelated version of that signal which is generated at the decoder.

It has been found that e.g. the usage of such parameters incurs a significant complexity for calculating and handling these parameters. Particularly, the ILD parameter is problematic, since it can have values that are very small or very big and this almost unrestricted range of values raises problems with respect to an efficient calculation, quantization etc.

SUMMARY

According to an embodiment, an apparatus for encoding a multi-channel signal having at least two channels may have: a downmixer for calculating a downmix signal from the multi-channel signal; a parameter calculator for calculating a side gain from a first channel of the at least two channels and a second channel of the at least two channels and for calculating a residual gain from the first channel and the second channel; and an output interface for generating an output signal, the output signal having information on the downmix signal, and on the side gain and the residual gain.

According to another embodiment, an apparatus for decoding an encoded multi-channel signal may have: an input interface for receiving the encoded multi-channel signal and for obtaining a downmix signal, a side gain and a residual gain from the encoded multi-channel signal; a residual signal synthesizer for synthesizing a residual signal using the residual gain; and an upmixer for upmixing the downmix signal using the side gain and the residual signal to obtain a reconstructed first channel and a reconstructed second channel.

According to another embodiment, a method of encoding a multi-channel signal having at least two channels may have the steps of: calculating a downmix signal from the multi-channel signal; calculating a side gain from a first channel of the at least two channels and a second channel of the at least two channels and calculating a residual gain from the first channel and the second channel; and generating an output signal, the output signal having information on the downmix signal, and on the side gain and the residual gain.

According to still another embodiment, a method of decoding an encoded multi-channel signal may have the steps of: receiving the encoded multi-channel signal and for obtaining a downmix signal, a side gain and a residual gain from the encoded multi-channel signal; synthesizing a residual signal using the residual gain; and upmixing the downmix signal using the side gain and the residual signal to obtain a reconstructed first channel and a reconstructed second channel.

Another embodiment may have a non-transitory digital storage medium having stored thereon a computer program for performing a method of encoding a multi-channel signal having at least two channels having the steps of: calculating a downmix signal from the multi-channel signal; calculating a side gain from a first channel of the at least two channels and a second channel of the at least two channels and calculating a residual gain from the first channel and the second channel; and generating an output signal, the output signal having information on the downmix signal, and on the side gain and the residual gain, when said computer program is run by a computer.

Another embodiment may have a non-transitory digital storage medium having stored thereon a computer program for performing a method of decoding an encoded multi-channel signal having the steps of: receiving the encoded multi-channel signal and for obtaining a downmix signal, a side gain and a residual gain from the encoded multi-channel signal; synthesizing a residual signal using the residual gain; and upmixing the downmix signal using the side gain and the residual signal to obtain a reconstructed first channel and a reconstructed second channel, when said computer program is run by a computer.

Another embodiment may have an encoded multi-channel signal having information on a downmix signal, a side gain and a residual gain.

The present invention of a first aspect is based on the finding that, in contrast to the known technology, a different parametric encoding procedure is adopted that relies on two gain parameters, i.e., a side gain parameter and a residual gain parameter. Both gain parameters are calculated from a first channel of at least two channels of a multichannel signal and a second channel of the at least two channels of the multichannel signal. Both of these gain parameters, i.e., the side gain and the residual gain are transmitted or stored or, generally output together with a downmix signal that is calculated from the multichannel signal by a downmixer.

Embodiments of the present invention of the first aspect are based on a new mid/side approach, leading to a new set of parameters: at the encoder a mid/side transformation is applied to the input channels, which together capture the full information of two input channels. The mid signal is a weighted mean value of left and right channel, where the weights are complex and chosen to compensate for phase differences. Accordingly, the side signal is the corresponding weighted difference of the input channels. Only the mid signal is waveform coded while the side signal is modelled parametrically. The encoder operates in subbands where it extracts IPDs and two gain parameters as stereo parameter.

The first gain, which will be referred to as the side gain, results from a prediction of the side signal by the mid signal and the second gain, which will be referred to as residual gain, captures the energy of the remainder relative to the energy of the mid signal. The mid signal then serves as a downmix signal, which is transmitted alongside the stereo parameters to the decoder.

The decoder synthesizes two channels by estimating the lost side channel based on the side gain and the residual gain and using a substitute for the remainder.

The present invention of the first aspect is advantageous in that the side gain on the one hand and the residual gain on the other hand are gains that are limited to a certain small range of numbers. Particularly, the side gain is, in embodiments, limited to a range of −1 to +1, and the residual gain is even limited to a range of 0 and 1. And, what is even more useful in an embodiment is that the residual gain depends on the side gain so that the range of values that the residual gain can have is becoming the smaller the bigger the side gain becomes.

Particularly, the side gain is calculated as a side prediction gain that is applicable to a mid signal of the first and the second channel in order to predict a side signal of the first and second channels. And the parameter calculator is also configured to calculate the residual gain as a residual prediction gain indicating an energy of or an amplitude of a residual signal of such a prediction of the side signal by the mid signal and the side gain.

Importantly, however, it is not necessary to actually perform the prediction on the encoder side or to actually encode the side signal on the encoder side. Instead, the side gain and the residual gain can be calculated by only using amplitude related measures such as energies, powers, or other characteristics related to the amplitudes of the left and the right channel. Additionally, the calculation of the side gain and the residual gain is only related to the inner product between both channels, i.e., any other channels apart from the left channel and the right channel, such as the downmix channel itself or the side channel itself are not necessary to be calculated in embodiments. However, in other embodiments, the side signal can be calculated, different trials for predictions can be calculated and the gain parameters such as the side gain and the residual gain can be calculated from a residual signal that is associated with a certain side gain prediction resulting in a predefined criterion in the different trials such as a minimum energy of the residual or remainder signal. Thus, there exists high flexibility and, nevertheless, low complexity for calculating the side gain on the one hand and the residual gain on the other hand.

There are exemplary two advantages of the gain parameters over ILD and ICC. First, they naturally lie in finite intervals (the side gain in [−1,1] and the residual gain in [0,1]) as opposed to the ILD parameter, which may take arbitrary large or small values. And second, the calculation is less complex, since it only involves a single special function evaluation, whereas the calculation of ILD and ICC involves two.

Embodiments of the first aspect rely on the calculation of the parameters in the spectral domain, i.e., the parameters are calculated for different frequency bins or, more advantageously, for different subbands where each subband comprises a certain number of frequency bins. In an embodiment, the number of frequency bins included within a subband increases from lower to higher subbands in order to mimic the characteristic of the human listening perception, i.e., that higher bands cover higher frequency ranges or bandwidths and lower bands cover lower frequency ranges or bandwidths.

In an embodiment, the downmixer calculates an absolute phase compensated downmix signal where, based on an IPD parameter, phase rotations are applied to the left and to the right channel, but the phase compensation is performed in such a way that the channel having more energy is less rotated than the channel having less energy. For controlling the phase compensation, the side gain may be used, however, in other embodiments, any other downmix can be used, and this is also a specific advantage of the present invention that the parametric representation of the side signal, i.e., the side gain on the one hand and the residual gain on the other hand are calculated only based on the original first and second channels, and any information on a transmitted downmix is not required. Thus, any downmix can be used together with the new parametric representation consisting of the side gain and the residual gain, but the present invention is also particularly useful for being applied together with an absolute phase compensation that is based on the side gain.

In a further embodiment of the absolute phase compensation, the phase compensation parameter is particularly calculated based on a specific predetermined number so that the singularity of the arctangent function (atan or $\tan^{-1}$) that occurs in calculating the phase compensation parameter is moved from the center to a certain side position. This shifting of the singularity makes sure that any problems due the singularity do not occur for phase shifts of +1-180° and a gain parameter close to 0, i.e., left and right channels that have quite similar energies. Such signals have been found to occur quite often, but signals being out of phase with each other but having a difference, for example, between 3 and 12 dB or around 6 dB do not occur in natural situations. Thus, although the singularities is only shifted, it has been found that this shifting nevertheless improves the overall performance of the downmixer, since this shifting makes sure that the singularity occurs at a signal constellation situation that occurs, in normal situations, much less than where the straightforward arctangent function has its singularity point.

Further embodiments make use of the dependency of the side gain and the residual gain for implementing an efficient quantization procedure. To this end, it is of advantage to perform a joint quantization that, in a first embodiment, is performed so that the side gain is quantized first and, then the residual gain is quantized using quantization steps that are based on the value of the side gain. However, other embodiments rely on a joint quantization, where both parameters are quantized into a single code, and certain portions of this code rely on certain groups of quantization points that belong to a certain level difference characteristic of the two channels that are encoded by the encoder.

A second aspect relates to an apparatus for downmixing a multi-channel signal comprising at least two channels, the apparatus comprising: a downmixer for calculating a downmix signal from the multi-channel signal, wherein the downmixer is configured to calculate the downmix using an absolute phase compensation, so that a channel having a lower energy among the at least two channels is only rotated or is rotated stronger than a channel having a greater energy in calculating the downmix signal; and an output interface for generating an output signal, the output signal comprising information on the downmix signal.

Advantageously, the rotation may be carried out on the minor channel, but the case can be in small energy difference situations that the minor channel is not always rotated more than the major channel, But, if the energy ratio is sufficiently large or sufficiently small, then the embodiment rotates the minor channel more than the major channel. Thus, advantageously, the minor channel is rotated more than the major channel only when the energy difference is significant or is more than a predefined threshold such as 1 dB or more. This applies not only for the downmixer but also for the upmixer.

BRIEF DESCRIPTION OF THE DRAWINGS

Embodiments of the present invention are subsequently discussed with respect to the attached drawings, in which.

DETAILED DESCRIPTION OF THE INVENTION

Figure 1:
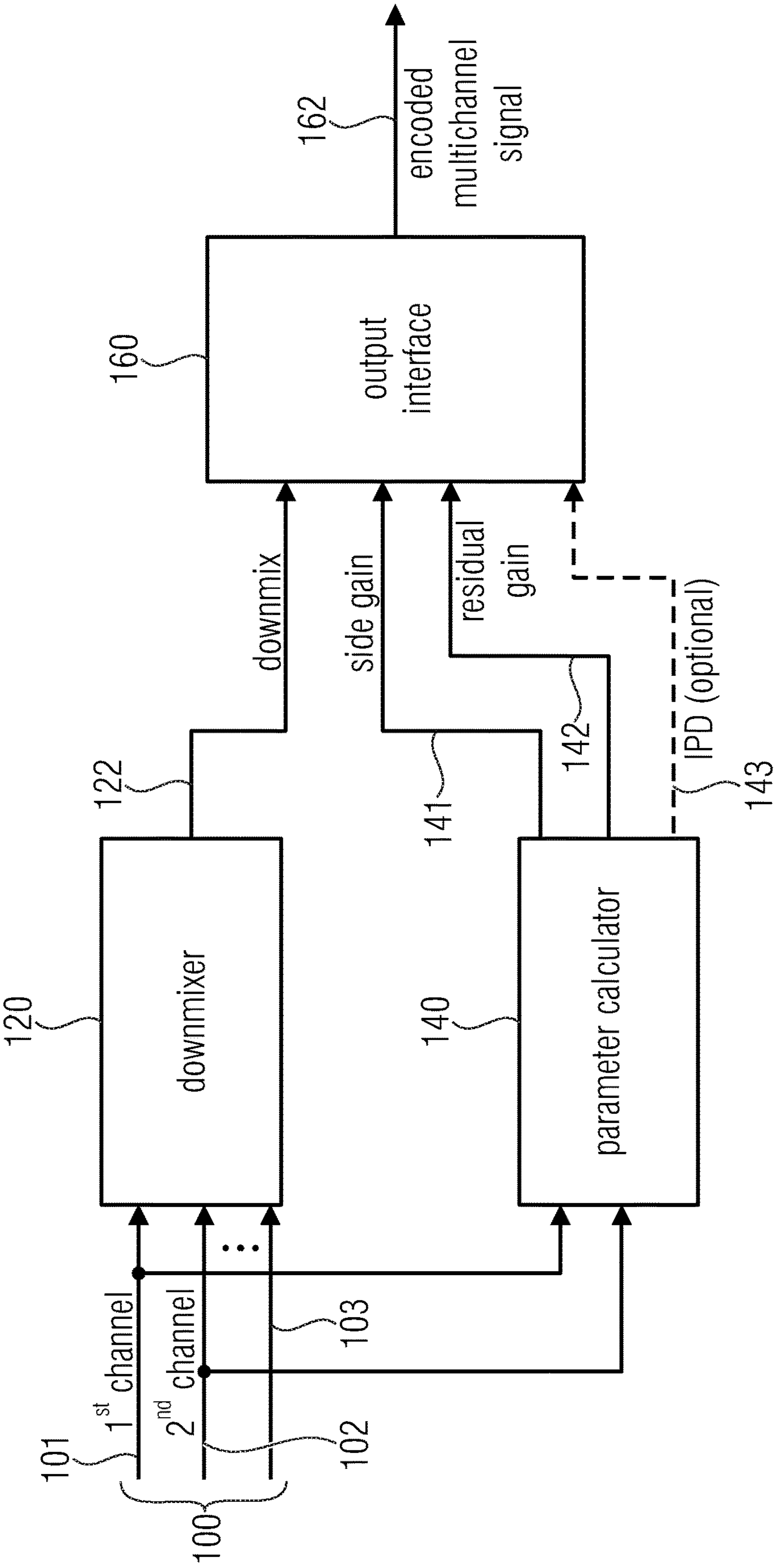
FIG. 1 is a block diagram of an apparatus for encoding a multichannel signal of an embodiment.

FIG. 1 illustrates an apparatus for encoding a multichannel signal comprising at least two channels. Particularly, the multichannel signal is illustrated at 100 in FIG. 1 and has a first channel 101 and a second channel 102 and no additional channels or an arbitrarily selected number of additional channels where a further additional channel is illustrated at 103.

The multichannel signal 100 is input into a downmixer 120 for calculating a downmix signal 122 from the multichannel signal 100. The downmixer can use, for calculating the multichannel signal, the first channel 101, the second channel 102 and the third channel 103 or only the first and the second channel or all channels of the multichannel signal depending on the certain implementation.

Furthermore, the apparatus for encoding comprises a parameter calculator 140 for calculating a side gain 141 from the first channel 101 and the second channel 102 of the at least two channels and, additionally, the parameter calculator 104 calculates a residual gain 142 from the first channel and the second channel. In other embodiments, an optional inter-channel phase difference (IPD) is also calculated as illustrated at 143. The downmix signal 122, the side gain 141 and the residual gain 142 are forwarded to an output interface 160 that generates an encoded multichannel signal 162 that comprises information on the downmix signal 122, on the side gain 141 and the residual gain 142.

It is to be noted that the side gain and the residual gain are typically calculated for frames so that, for each frame, a single side gain and the single residual gain is calculated. In other embodiments, however, not only a single side gain and a single residual gain is calculated for each frame, but a group of side gains and the group of residual gains are calculated for a frame where each side gain and each residual gain are related to a certain subband of the first channel and the second channel. Thus, in embodiments, the parameter calculator calculates, for each frame of the first and the second channel, a group of side gains and a group of residual gains, where the number of the side and the residual gains for a frame is typically equal to the number of subbands. When a high resolution time-spectrum-conversion is applied such as a DFT, the side gain and the residual gain for a certain subband are calculated from a group of frequency bins of the first channel and the second channel. However, when a low resolution time-frequency transform is applied that results in subband signals, then the parameter calculator 140 calculates, for each subband or even for a group of subbands a side gain and a residual gain.

When the side gain and the residual gain are calculated for a group of subband signals, then the parameter resolution is reduced resulting in a lower bitrate but also resulting in a lower quality representation of the parametric representation of the side signal. In other embodiments, the time resolution can also be modified so that a side gain and a residual gain are not calculated for each frame but are calculated for a group of frames, where the group of frames has two or more frames. Thus, in such an embodiment, it is of advantage to calculate subband-related side/residual gains, where the side/residual gains refer to a certain subband, but refer to a group of frames comprising two or more frames. Thus, in accordance with the present invention, the time and frequency resolution of the parameter calculation performed by block 140 can be modified with high flexibility.

Figure 2:
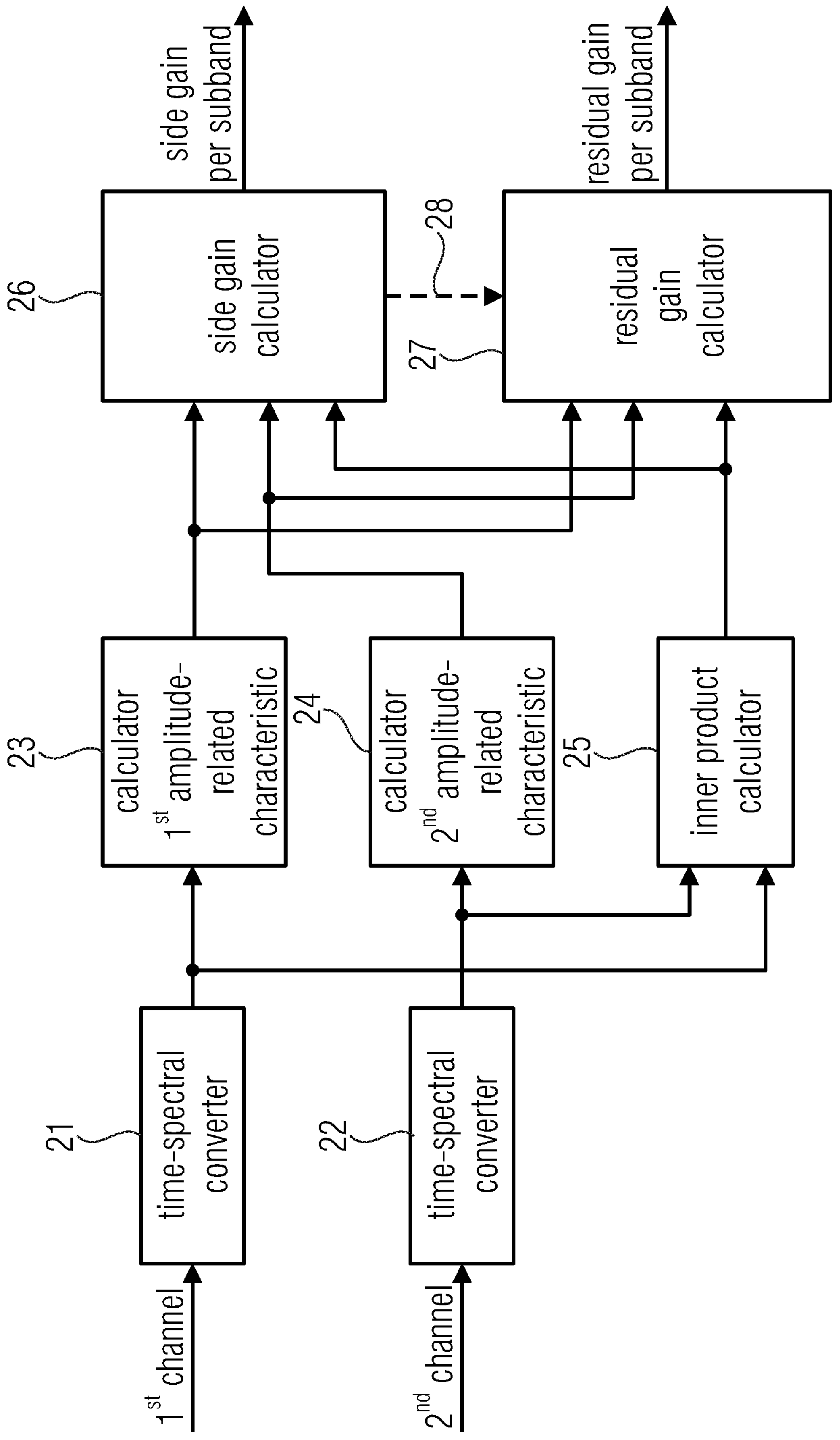
FIG. 2 is a block diagram of an embodiment of the parameter calculator.
Figure 3:
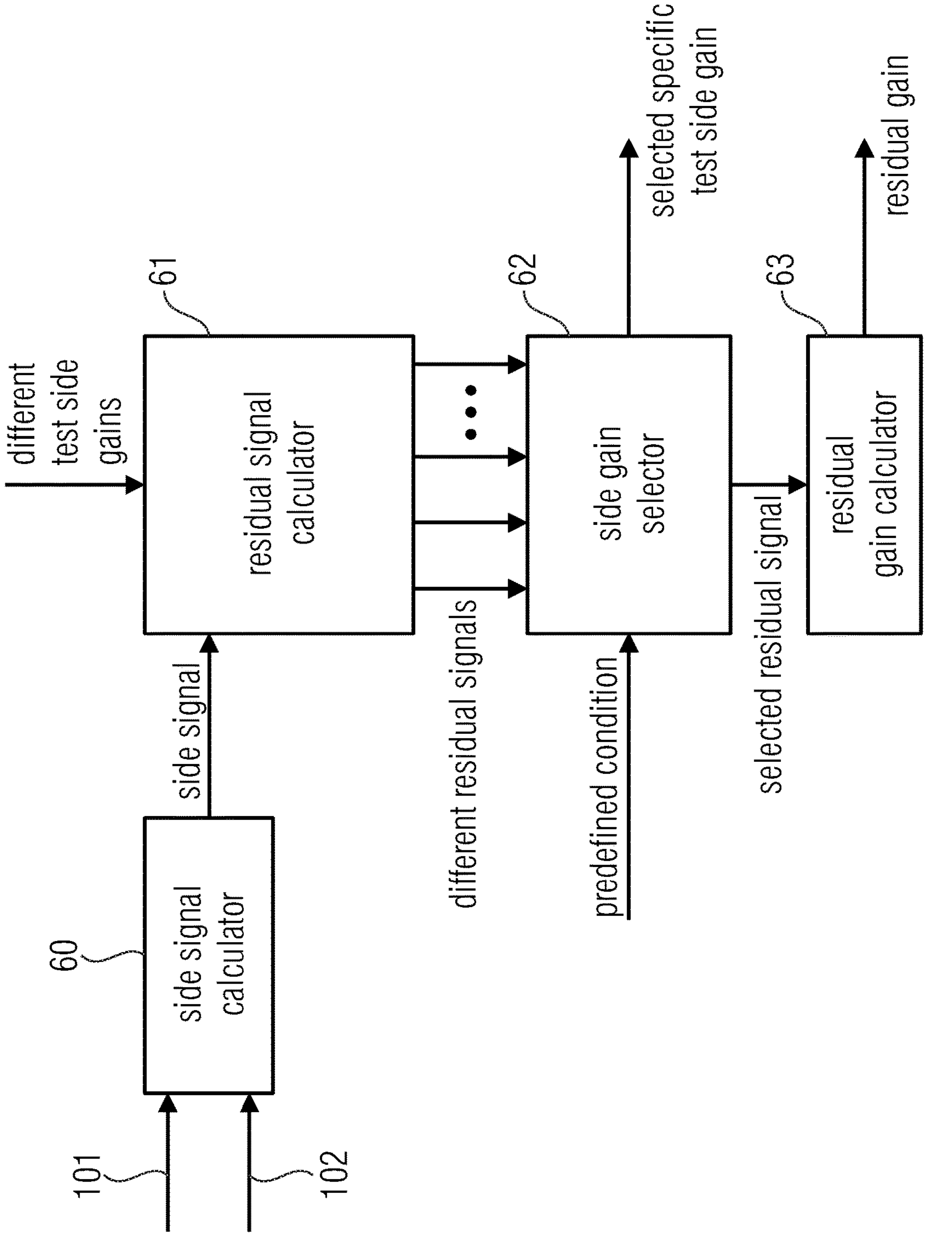
FIG. 3 is a further embodiment of the parameter calculator.

The parameter calculator 140 may be implemented as outlined in FIG. 2 with respect to a first embodiment or as outlined in FIG. 3 with respect to a second embodiment. In the FIG. 2 embodiment, the parameter calculator comprises a first time-spectral converter 21 and a second time-spectral converter 22. Furthermore, the parameter calculator 140 of FIG. 1 comprises a calculator 23 for calculating a first amplitude-related characteristic and a calculator 24 for calculating a second amplitude-related characteristic and a calculator 25 for calculating an inner product of the output of blocks 21 and 22, i.e., of the spectral representation of the first and second channels.

The outputs of blocks 23, 24, 25 are forwarded to a side gain calculator 26 and are also forwarded to a residual gain calculator 27. The side gain calculator 26 and the residual gain calculator 27 apply a certain relation among the first amplitude related characteristic, the second amplitude related characteristic and the inner product and the relation applied by the residual gain calculator for combining both inputs is different from the relation that is applied by the side gain calculator 26.

In an embodiment, the first and the second amplitude related characteristics are energies in subbands. However, other amplitude related characteristics relate to the amplitudes in subbands themselves, relate to signal powers in subbands or relate to any other powers of amplitudes with an exponent greater than 1, where the exponent can be a real number greater than 1 or an integer number greater than 1 such an integer number of 2 relating to a signal power and an energy or relating to an number of 3 that is associated with loudness, etc. Thus, each amplitude-related characteristic can be used for calculating the side gain and the residual gain.

In an embodiment, the side gain calculator and the residual gain calculator 27 are configured to calculate the side gain as a side prediction gain that is applicable to a mid-signal of the first and the second channels to predict a side signal of the first and the second channels or the parameter calculator and, particularly, the residual gain calculator 27 is configured to calculate the residual gain as a residual prediction gain indicating an amplitude related measure of a residual signal of a prediction of the side signal by the mid-signal using the side gain.

In particular, the parameter calculator 140 and the side gain calculator 26 of FIG. 2 is configured to calculate the side signal using a fraction having a nominator and a denominator, wherein the nominator comprises amplitude characteristics of the first and the second channel and the denominator comprises the amplitude characteristic of the first and the second channels and a value derived from the inner product. The value derived from the inner product may be the absolute value of the inner product but can alternatively be any power of the absolute value such as a power greater than 1, or can even be a characteristic different from the absolute value such as a conjugate complex term or the inner product itself or so on.

In a further embodiment, the parameter calculator the residual gain calculator 27 of FIG. 2 also uses a fraction having a nominator and a denominator both using a value derived from the inner product and, additionally, other parameters. Again, the value derived from the inner product may be the absolute value of the inner product but can alternatively be any power of the absolute value such as a power greater than 1, or can even be a characteristic different from the absolute value such as a conjugate complex term or the inner product itself or so on.

In particular, the side calculator 26 of FIG. 2 is configured to use, for calculating the side gain, the difference of energies of the first channels and the denominator uses a sum of the energies or amplitude characteristics of both channels and, additionally, an inner product and advantageously two times the inner product but other multipliers for the inner product can also be used.

The residual gain calculator 27 is configured for using, in the nominator, a weighted sum of the amplitude characteristics of the first and the second channels and an inner product where the inner product is subtracted from the weighted sum of the amplitude characteristics of the first and the second channels. The denominator for calculating the residual gain calculator comprises a sum of the amplitude characteristics of the first and the second channel and the inner product where the inner product may be multiplied by two but can be multiplied by other factors as well.

Furthermore, as illustrated by the connection line 28, the residual gain calculator 27 is configured for calculating the residual gain using the side gain calculated by the side gain calculator.

In an embodiment, the residual gain and the side gain operate as follows. In particular, the bandwise inter-channel phase differences that will be described later on can be calculated or not. However, before particularly outlining the calculation of the side gain as illustrated later on in equation (9) and the specific advantageous calculation of the side gain as illustrated later on in equation (10), a further description of the encoder is given that also refers to a calculation of IPDs and downmixing in addition to the calculation of the gain parameters.

Encoding of stereo parameters and computation of the downmix signal is done in frequency domain. To this end, time frequency vectors $L_t$ and $R_t$ of the left and right channel are generated by simultaneously applying an analysis window followed by a discrete Fourier transform (DFT): The DFT bins are then grouped into subbands $(L_t,k)_k \in I_b$ resp. $(R_t,k)_k \in I_b$, where $I_b$ denotes the set of subbands indices.

Calculation of IPDs and Downmixing

For the downmix, a bandwise inter-channel-phase-difference (IPD) is calculated as $$IPD_{t,b}=\arg(\Sigma_{k\in I_b} L_{t,k} R^*_{t,k}) \tag{1}$$

where z* denotes the complex conjugate of z. This is used to generate a bandwise mid and side signal $$M_{t,k} = \frac{e^{-i\beta} L_{t,k} + e^{i(IPD_{t,b}-\beta)} R_{t,k}}{\sqrt{2}} \tag{2}$$

and $$S_{t,k} = \frac{e^{-i\beta} L_{t,k} + e^{i(IPD_{t,b}-\beta)} R_{t,k}}{\sqrt{2}} \tag{3}$$

for $k \in I_b$. The absolute phase rotation parameter $\beta$ is given by $$\beta = \operatorname{atan2}\left(\sin(IPD_{t,b}), \cos(IPD_{t,b}) + 2\frac{1+g_{t,b}}{1-g_{t,b}}\right) \tag{4}$$

where $g_{t,b}$ denotes the side gain which will be specified below. Here, atan 2(y,x) is the two argument arctangent function whose value is the angle between the point (x,y) and the positive x-axis. It is intended to carry out the IPD compensation rather on the channel which has less energy. The factor 2 moves the singularity at $IPD_{t,b}=\pm\pi$ and $g_{t,b}=0$ to $IPD_{t,b}=\pm\pi$ and $g_{t,b}=-1/3$. This way toggling of $\beta$ is avoided in out-of-phase situations with approximately equal energy distribution in left and right channel. The downmix signal is generated by applying the inverse DFT to $M_t$ followed by a synthesis window and overlap add.

In other embodiments, other arctangent functions different from atan 2-function can be used as well such as a straightforward tangent function, but the atan 2 function is of advantage due to its safe application to the posed problem.

Calculation of Gain Parameters

Additional to the band-wise IPDs, two further stereo parameters are extracted. The optimal gain for predicting $S_{t,b}$ by $M_{t,b}$, i.e. the number $g_{t,b}$ such that the energy of the remainder $$p_{t,k}=S_{t,k}-g_{t,b}M_{t,k} \tag{5}$$

is minimal, and a gain factor $r_{t,b}$ which, if applied to the mid signal $M_t$, equalizes the energy of $p_t$ and $M_t$ in each band, i.e.

$$r_{t,b} = \sqrt{\frac{\Sigma_{k\in I_b}|p_{t,k}|^2}{\Sigma_{k\in I_b}|M_{t,k}|^2}} \tag{6}$$

The optimal prediction gain can be calculated from the energies in the subbands $$E_{L,t,b} = \sum_{k \in I_b} |L_{t,k}|^2 \text{ and } E_{R,t,b} = \sum_{k \in I_b} |R_{t,k}|^2 \tag{7}$$

and the absolute value of the inner product of $L_t$ and $R_t$ $$X_{L/R,t,b} = \left| \sum_{k \in I_b} L_{t,k} R^*_{t,k} \right| \tag{8}$$

as $$g_{t,b} = \frac{E_{L,t,b} - E_{R,t,b}}{E_{L,t,b} + E_{R,t,b} + 2X_{L/R,t,b}} \tag{9}$$

From this it follows that $g_{t,b}$ lies in [−1,1]. The residual gain can be calculated similarly from the energies and the inner product as $$r_{t,b} = \left( \frac{(1 - g_{t,b})E_{L,t,b} + (1 + g_{t,b})E_{R,t,b} - 2X_{L/R,t,b}}{E_{L,t,b} + E_{R,t,b} + 2X_{L/R,t,b}} \right)^{1/2} \tag{10}$$

which implies $$0 \le r_{t,b} \le \sqrt{1 - g_{t,b}^2} \tag{11}$$

In particular, this shows that $r_{t,b} \in [0,1]$. This way, the stereo parameters can be calculated independently from the downmix by calculating the corresponding energies and the inner product. In particular, it is not necessary to compute the residual $p_{t,k}$ in order to compute its energy. It is noteworthy that calculation of the gains involves only one special function evaluation whereas calculation of ILD and ICC from $E_{L,t,b}$, $E_{R,t,b}$ and $X_{L/R,t,b}$ involves two, namely a square root and a logarithm:

$$ILD_{t,b} = 10\log_{10}\left(\frac{E_{L,t,b}}{E_{R,t,b}}\right) \tag{12}$$

and $$ICC_{t,b} = \frac{X_{L/R,t,b}}{\sqrt{E_{L,t,b} \cdot E_{R,t,b}}} \tag{13}$$

Lowering Parameter Resolution

If a lower parameter resolution as given by the window length is desired, one may compute the gain parameters over h consecutive windows by replacing $X_{L/R,t,b}$ by $$X_{L/R,t,b} = \sum_{s=t}^{t+h} X_{L/R,r,b} \tag{14}$$

and $E_{L,t,b}$ resp. $E_{R,t,b}$ by $$\varepsilon_{L/R,t,b} = \sum_{s=t}^{t+h} E_{L/R,r,b} \tag{15}$$

in (9) and (10). The side gain is then a weighted average of the side gains for the individual windows where the weights depend on the energy of $M_{t+i,k}$ or depends on the bandwise energies $E_{M,s,b}$, wherein s is the summation index in equations 14 and 15.

Similarly, the IPD values are then calculated over several windows as $$IPD_{t,b} = \arg\left( \sum_{t=t}^{t+h} \sum_{k \in I_b} L_{t,k} \; R^*_{t,k} \right) \tag{16}$$

Advantageously, the parameter calculator 140 illustrated in FIG. 1 is configured to calculate the subband-wise representation as a sequence of complex valued spectra, where each spectrum is related to a time frame of the first channel or the second channel, where the time frames of the sequence are adjacent to each other and where adjacent time frames overlap with each other.

Furthermore, the parameter generator 140 is configured to calculate the first and the second amplitude related measures by squaring magnitudes of complex spectral values in a subband and by summing squared magnitudes in the subband as, for example, also previously illustrated in equation (7), where index b stands for the subband.

Furthermore, as also outlined in equation 8, the parameter calculator 140 and, in particular, the inner product calculator 25 of FIG. 2 is configured to calculate the inner product by summing, in a subband, the products, wherein each product involves a spectral value in a frequency bin of the first channel and a conjugate complex spectral value of the second channel for the frequency bin. Subsequently, a magnitude of a result of the summing together is formed.

Figure 4:
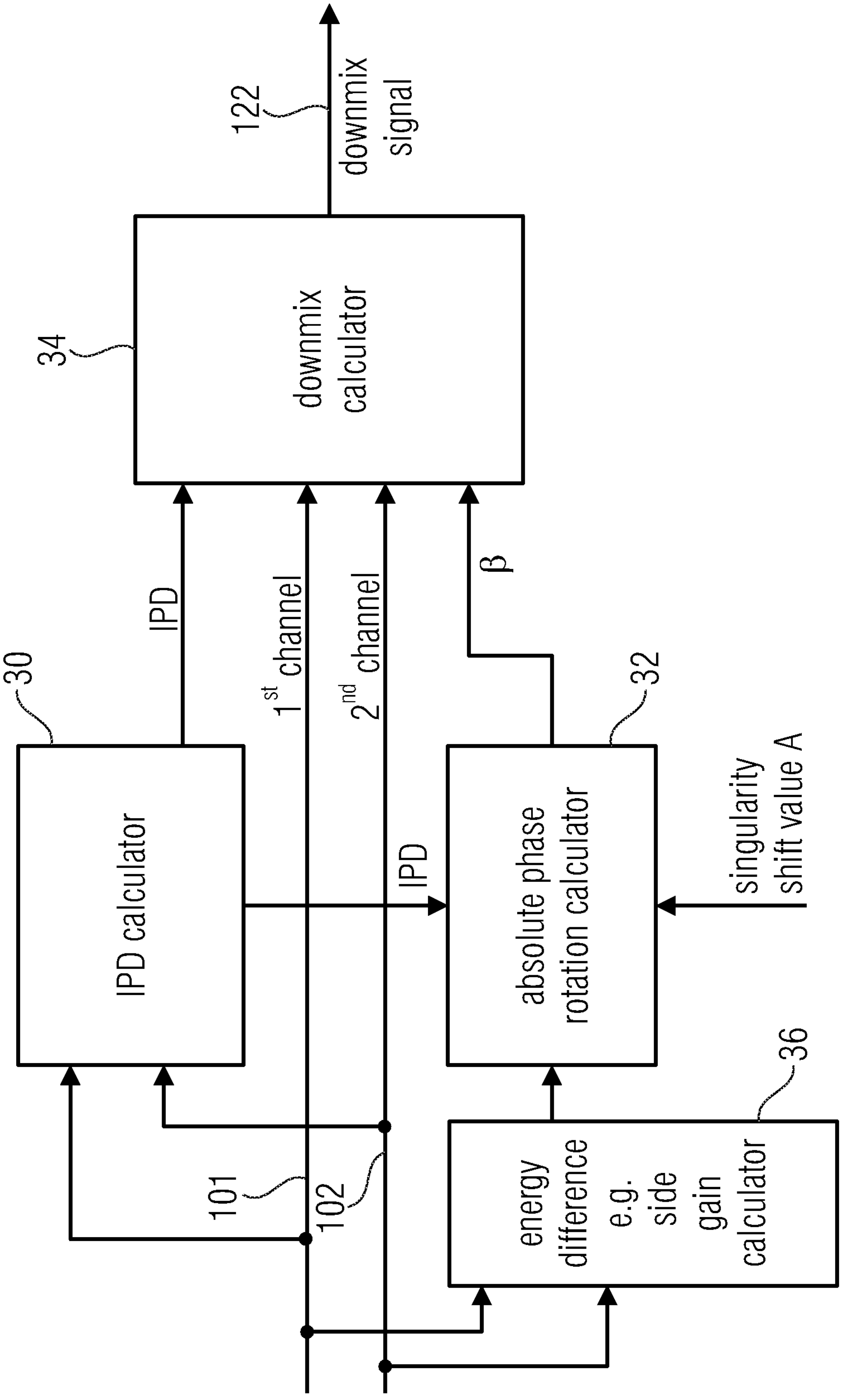
FIG. 4 is an embodiment of a downmixer performing an absolute phase compensation.

As also outlined in equations 1 to 4, it is of advantage to use an absolute phase compensation. Thus, in this embodiment, the downmixer 120 is configured to calculate the downmix 122 using an absolute phase compensation so that only the channel having the lower energy among the two channels is rotated or the channel having the lower energy among the two channels is rotated stronger than the other channel that has a greater energy when calculating the downmix signal. Such a downmixer 120 is illustrated in FIG. 4. In particular, the downmixer comprises an inter-channel phase difference (IPD) calculator 30, an absolute phase rotation calculator 32, a downmix calculator 34 and an energy difference or side gain calculator 36. It is to be emphasized that the energy difference or side gain calculator 36 can be implemented as the side gain calculator 26 in FIG. 2. Alternatively, however, for the purpose of phase rotation, there can also be a different implementation in block 36 that only calculates an energy difference or, in general, an amplitude related characteristic difference that can be the energy, the power or the amplitudes themselves or powers of the amplitudes that are added together where a power is different from two such as a power between one and two or greater than two.

In particular, an exponent or power of three corresponds, for example, to the loudness rather than to the energy.

In particular, the IPD calculator 30 of FIG. 4 is configured to calculate an inter-channel phase difference typically for each subband of a plurality of subbands of each of the first and the second channels 101, 102 input into block 30. Furthermore, the downmixer has the absolute phase rotation parameter, again typically for each subband of the plurality of subbands that operates based on an energy difference provided by block 36 between the first and the second channel or, in general, based on an amplitude-related characteristic difference between both channels 101, 102. Additionally, the downmix calculator 34 is configured to weight, when calculating the downmix signal, the first and the second channels using the IPD parameters and the absolute phase rotation parameters indicated as β.

Advantageously, block 36 is implemented as a side gain calculator so that the absolute phase rotation calculator operates based on the side gain.

Thus, block 30 of FIG. 4 is configured for implementing equation (1), block 32 is configured for implementing equation (4) and block 34 is configured for implementing equation (2) in an embodiment.

In particular, the factor 2 in equation (4) before the term involving the side gain $g_{t,b}$ can be set different from 2 and can be, for example, a value advantageously between 0.1 and 100. Naturally, also −0.1 and −100 can also be used. This value makes sure that the singularity existing at an IPD of +−180° for almost equal left and right channels is moved to a different place, i.e., to a different side gain of, for example, −⅓ for the factor 2. However, other factors different from 2 can be used. These other factors then move the singularity to a different side gain parameter from −⅓. It has been shown that all these different factors are useful since these factors achieve that the problematic singularity is at a "place" in the sound stage having associated left and right channel signals that typically occur less frequently than signals being out of phase and having equal or almost equal energy.

In the embodiment, the output interface 160 of FIG. 1 is configured for performing a quantization of the parametric information, i.e., a quantization of the side gain as provided on line 141 by the parameter calculator 140 and the residual gain as provided on line 142 from the parameter calculator 140 of FIG. 1.

Particularly in the embodiment, where the residual gain depends on the side gain, if it is of advantage to quantize the side gain and to then quantize the residual gain, wherein, in this embodiment, the quantization step for the residual gain depends on the value of the side gain.

Figure 11:
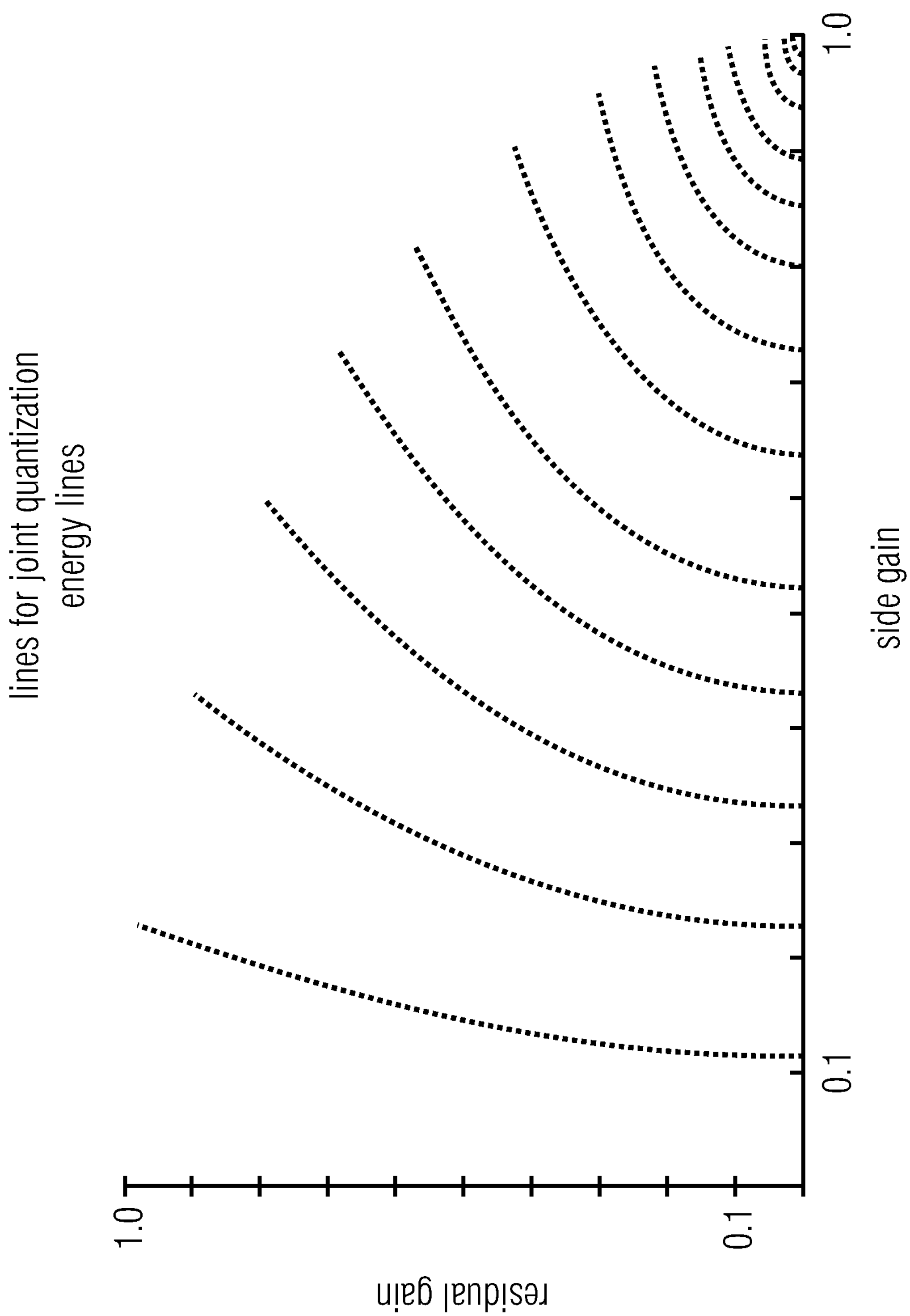
FIG. 11 illustrates lines for a conditional quantization in a first embodiment.
Figure 12:
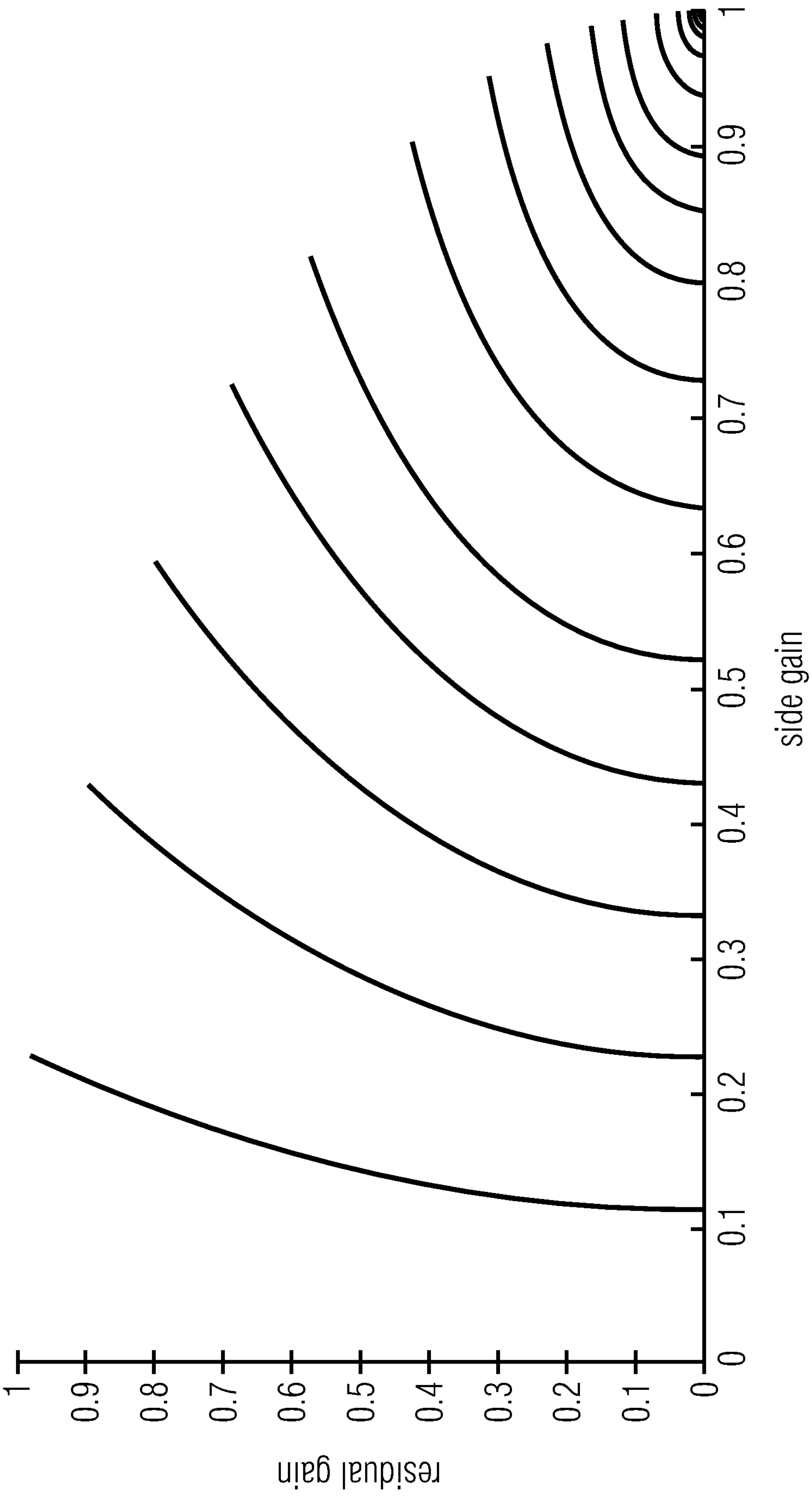
FIG. 12 illustrates lines for a joint quantization in accordance with a further embodiment.
Figure 13:
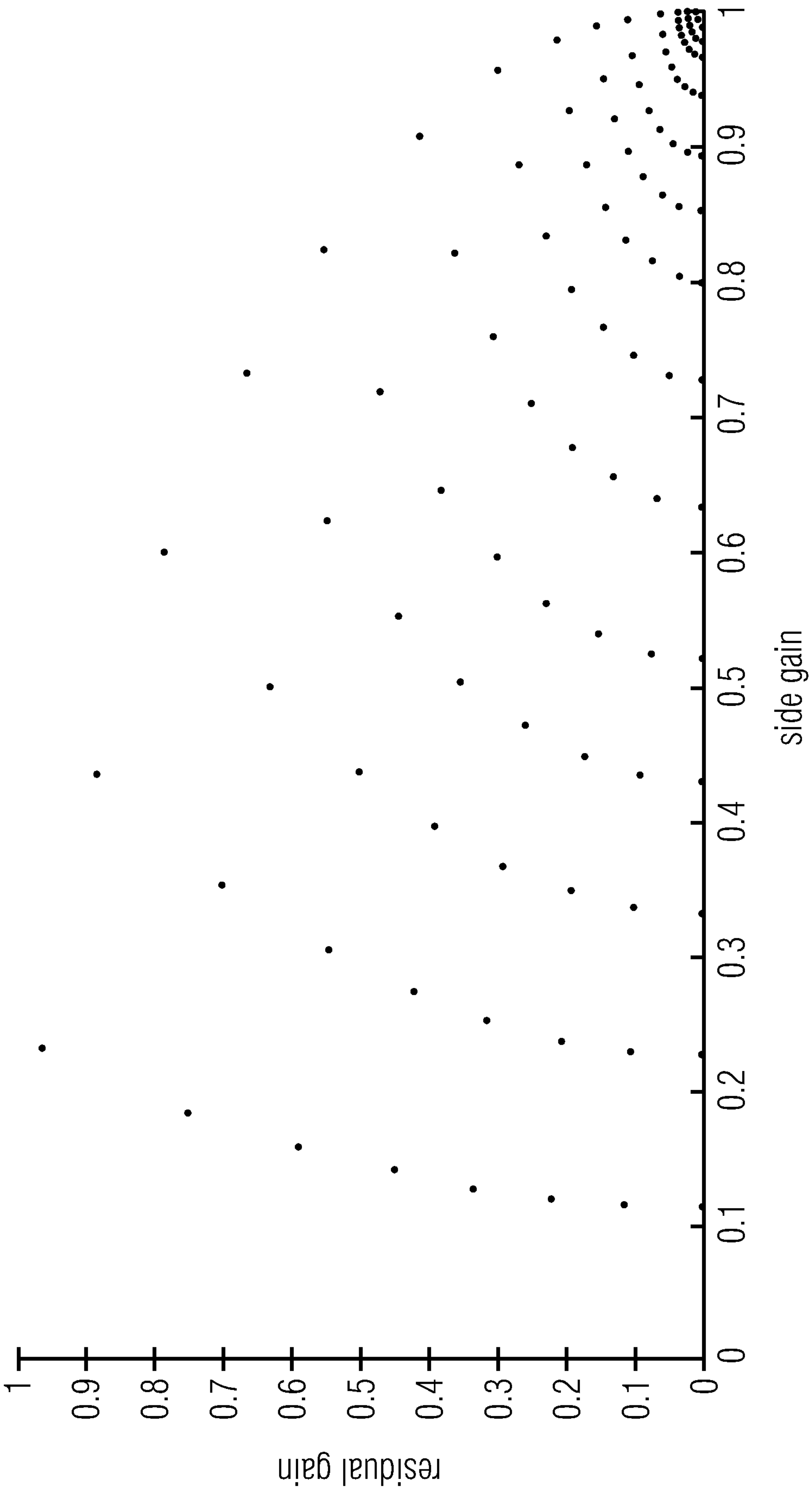
FIG. 13 illustrates joint quantization points for the side gain and the residual gain.

In particular, this is illustrated in FIG. 11 and analogously in FIGS. 12 and 13 as well.

FIG. 1 shows the lines for the conditional quantization. In particular, it has been shown that the residual gain is in a range determined by $(1-g^2)^{1/2}$. Thus, when g=0, then r can be in a range between 0 and 1. However, when g is equal to 0.5, then r can be in the range of 0.866 and 0. Furthermore, when, for example, g=0.75, then the range r is limited between 0 and 0.66. In an extreme embodiment where g=0.9, then r can only range between 0 and 0.43. Furthermore, when g=0.99, then r can only be in a range between 0 and 0.14, for example.

Thus, this dependency can be used by lowering the quantization step size for the quantization of the residual gain for higher side gains. Thus, when FIG. 11 is considered, the vertical lines that show the value range for r can be divided by a certain integer number such as 8 so that each line has eight quantization steps. Thus, it is clear that for lines reflecting higher side gains, the quantization step is smaller than for lines that have lower side gains. Thus, higher side gains can be quantized more finely without any increase of bitrate.

Figure 5A:
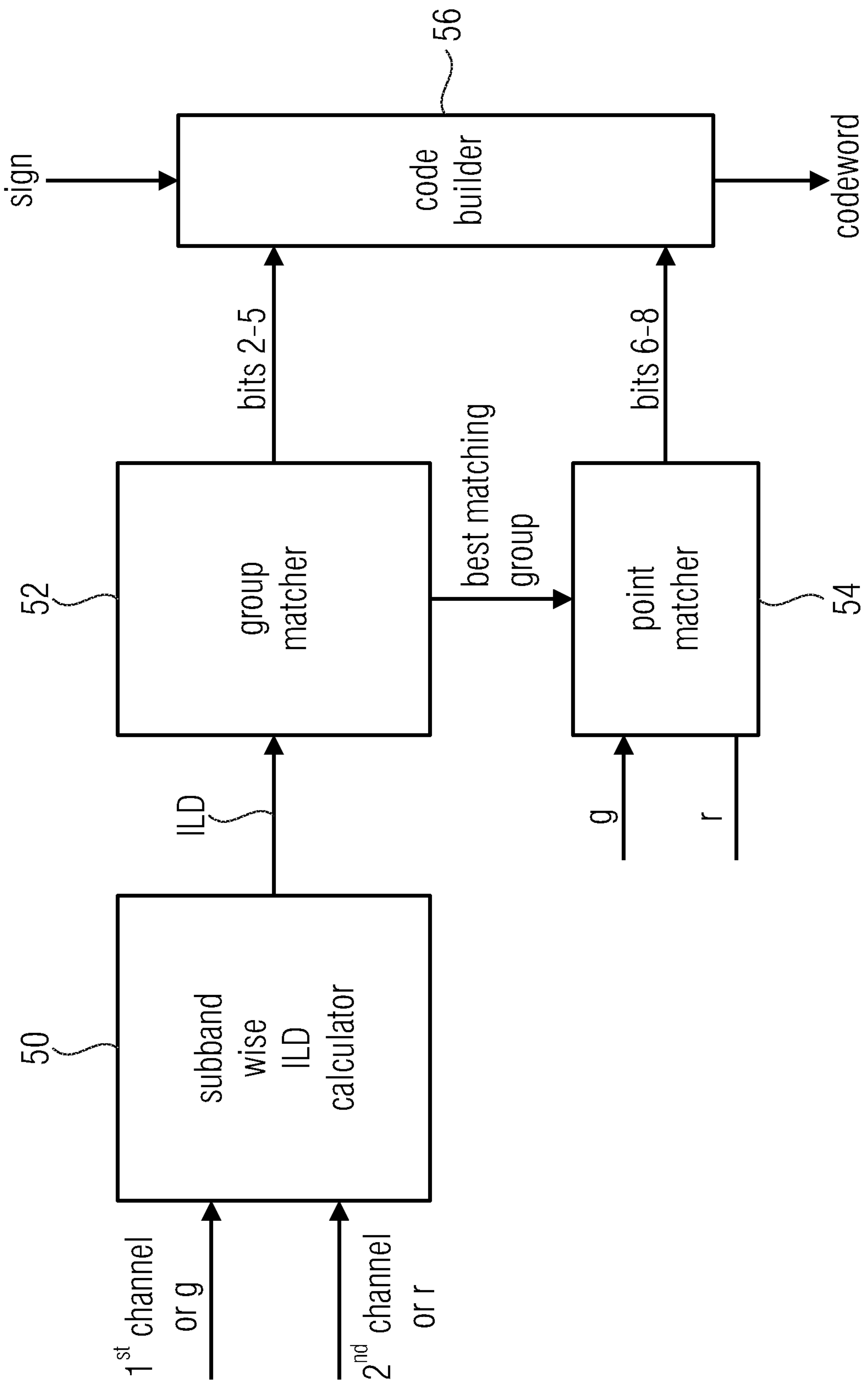
FIG. 5*a* is a block diagram of an embodiment of the output interface performing a specific quantization.

In a further embodiment, the quantizer is configured to perform a joint quantization using groups of quantization points, where each group of quantization points is defined by a fixed amplitude-related ratio between the first and the second channel. One example for an amplitude-related ratio is the energy between left and right, i.e., this means lines for the same ILD between the first and the second channel as illustrated in FIG. 12. In this embodiment, the output interface is configured as illustrated in FIG. 5*a* and comprises a subband-wise ILD calculator that receives, as an input, the first channel and the second channel or, alternatively, the side gain g and the residual gain r. The subband wise ILD calculator indicated by reference numeral 50 outputs a certain ILD for parameter values g, r to be quantized. The ILD or, generally, the amplitude-related ratio is forwarded to a group matcher 52. The group matcher 52 determines the best matching group and forwards this information to a point matcher 54. Both the group matcher 52 and the point matcher 54 feed a code builder 56 that finally outputs the code such as a codeword from a codebook.

Figure 5B:
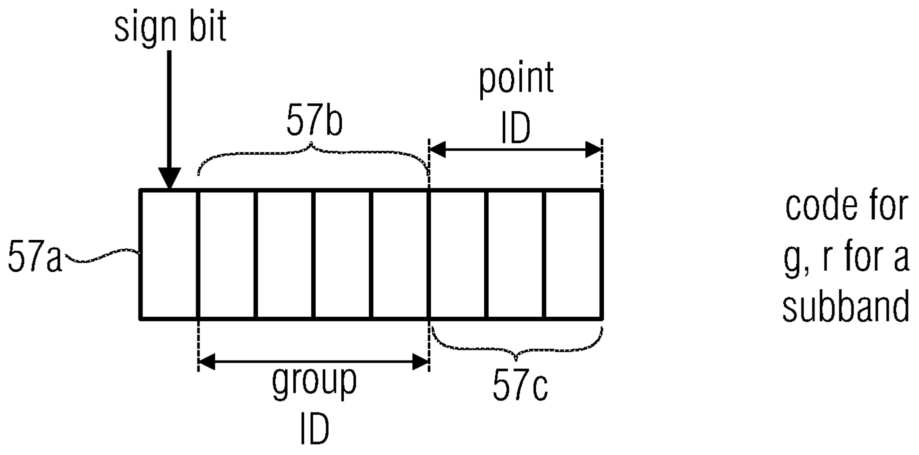
FIG. 5*b* indicates an exemplary codeword.

In particular, the code builder receives a sign of the side gain g and determines a sign bit 57*a* illustrated in FIG. 5*b* showing a code for g, r for a subband. Furthermore, the group matcher that has determined the certain group of quantization points matching with the determined ILD outputs bits 2 to 5 illustrated at 57*b* as the group ID. Finally, the point matcher outputs bits 6 to 8 in the embodiment of FIG. 5*b* illustrated at FIG. 57*c*, where these bits indicate the point ID, i.e., the ID of the quantization point within the group indicated by the bits 57*b*. Although FIG. 5*b* indicates an eight bit code having a single sign bit, four group bits and three point bits, other codes can be used having a sign bit and more or less group bits and more or less point bits. Due to the fact that the side gain has positive and negative values, the group bits and the point bits, i.e., the set of bits 57*b* and the set of bits 57*c*, only have either purely negative or, advantageously, purely positive values and should the sign bit indicate an negative sign then the residual gain is decoded as a positive value but the side gain is then decoded as a negative value which means that the energy of the left channel is lower than the energy of the right channel, when the rule as illustrated in equation 9 is applied for calculating the side gain.

Subsequently, further embodiments for the quantization are outlined

Quantization of Side and Residual Gain

The inequalities in (11) reveal a strong dependence of the residual gain on the side gain, since the latter determines the range of the first. Quantizing the side gain g and the residual gain r independently by choosing quantization points in [−1, 1] and [0,1] is therefore inefficient, since the number of possible quantization points for r would decrease as g tends towards ±1.

Conditional Quantization

There are different ways to handle this problem. The easiest way is to quantize g first and then to quantize r conditional on the quantized value $\tilde{g}$ whence the quantization points will lie in the interval $[0, \sqrt{1-\tilde{g}^2}]$. Quantization points can then e.g., be chosen uniformly on these quantization lines, some of which are depicted in FIG. 11.

Joint Quantization

A more sophisticated way to choose quantization points is to look at lines in the (g, r)-plane which correspond to a fixed energy ratio between L and R. If $c^2 \geq 1$ denotes such an energy ratio, then the corresponding line is given by either (0, s) for $0 \leq s \leq 1$ if c=1 or $$\left(s, \sqrt{\frac{(1+s)^2 - c^2(1-s)^2}{c^2-1}}\right) \text{ for } \frac{c-1}{c+1} \leq s \leq \frac{c^2-1}{c^2+1} \quad (22)$$

This also covers the case $c^2<1$ since swapping $L_t$ and $R_t$ only changes the sign of $g_{t,b}$ and leaves $r_{t,b}$ unchanged.

This approach covers a larger region with the same number of quantization points as can be seen from FIG. 12. Again, quantization points on the lines can e.g. be chosen uniformly according to the length of the individual lines. Other possibilities include choosing them in order to match pre-selected ICC-values or optimizing them in an acoustical way.

A quantization scheme that has been found to work well is based on energy lines corresponding to ILD values $$\pm\{0,2,4,6,8,10,13,16,19,22,25,30,35,40,45,50\}, \quad (23)$$

on each of which 8 quantization points are selected. This gives rise to a code-book with 256 entries, which is organized as a 8×16 table of quantization points holding the values corresponding to non-negative values of g and a sign bit. This gives rise to a 8 bit integer representation of the quantization points (g, r) where e.g. the first bit specifies the sign of g, the next four bits hold the column index in the 8×16 table and the last three bits holding the row index.

Quantization of $(g_{t,b}, r_{t,b})$ could be done by an exhaustive code-book search, but it is more efficient to calculate the subband ILD first and restrict the search to the best-matching energy line. This way, only 8 points need to be considered.

Dequantization is done by a simple table lookup.

The 128 quantization points for this scheme covering the non-negative values of g are displayed in FIG. 12.

Although a procedure has been disclosed for calculating the side gain and the residual gain without an actual calculation of the side signal, i.e., the difference signal between the left and the right signals as illustrated in equation (9) and equation (10), a further embodiment operates to calculate the side gain and the residual gain differently, i.e., with an actual calculation of the side signal. This procedure is illustrated in FIG. 3.

In this embodiment, the parameter calculator 140 illustrated in FIG. 1 comprises a side signal calculator 60 that receives, as an input, the first channel 101 and the second channel 102 and that outputs the actual side signal that can be in the time domain but that may be calculated in the frequency domain as, for example, illustrated by equation 3. However, although equation 3 indicates the situation of the calculation of the side signal with an absolute phase rotation parameter β and an IPD parameter per band and frame, the side signal can also be calculated without phase compensation. Equation 3 becomes an equation where only $L_{t,k}$ and $R_{t,k}$ occur. Thus, the side signal can also be calculated as a simple difference between left and right or first and second channels and the normalization with the square root of 2 can be used or not.

The side signal as calculated by the side signal calculator 60 is forwarded to a residual signal calculator 61. The residual signal calculator 62 performs the procedure illustrated in equation (5), for example. The residual signal calculator 61 is configured to use different test side gains, i.e., different values for the side gain $g_{d,b}$, i.e., different test side gains for one and the same band and frame and, consequently, different residual signals are obtained as illustrated by the multiple outputs of block 61.

The side gain selector 62 in FIG. 3 receives all the different residual signals and selects one of the different residual signals or, the test side gain associated with one of the different residual signals that fulfils a predefined condition. This predefined condition can, for example, be that the side gain is selected that has resulted in a residual signal having the smallest energy among all the different residual signals. However, other predetermined conditions can be used such as the smallest amplitude-related condition different from an energy such as a loudness. However, other procedures can also be applied such as that the residual signal is used that has not the smallest energy but the energy that is among the five smallest energies. Actually, a predefined condition can also be to select a residual signal that is showing a certain other audio characteristic such as certain features in certain frequency ranges.

The selected specific test side gain is determined by the side gain selector 62 as the side gain parameter for a certain frame or for a certain band and a certain frame. The selected residual signal is forwarded to the residual gain calculator 63 and the residual gain calculator can, in an embodiment, simply calculate the amplitude related characteristic of the selected residual signal or can, advantageously, calculate the residual gain as a relation between the amplitude related characteristic of the residual signal with respect to the amplitude-related characteristic of the downmix signal or mid-signal. Even when a downmix is used that is different from a phase compensated downmix or is different from a downmix consisting of a sum of left and right, then the residual gain can, nevertheless, be related to a non-phase compensated addition of left and right, as the case may be.

Thus, FIG. 3 illustrates a way to calculate the side gain and the residual gain with an actual calculation of the side signal while, in the embodiment of FIG. 2 that roughly reflects equation 9 and equation 10, the side gain and the residual gain are calculated without explicit calculation of the side signal and without performing a residual signal calculation with different test side gains. Thus, it becomes clear that both embodiments result in a side gain and a residual gain parameterizing a residual signal from a prediction and other procedures for calculating the side gain and the residual gain apart from what is illustrated in FIGS. 2 and 3 or by the corresponding equations 5 to 10 are also possible.

Furthermore, it is to be noted here that all the equations given are advantageous embodiments for the values determined by the corresponding equations. However, it has been found that values that are different in a range of advantageously +−20% from the values as determined by the corresponding equations are also useful and already provide advantages over the known technology, although the advantages become greater when the deviation from the values as determined by the equations becomes smaller. Thus, in other embodiments, it is of advantage to use values that are only different from the values as determined by the corresponding equations by +−10% and, in an advantageous embodiment, the values determined by the equations are the values used for the calculation of the several data items.

Figure 6:
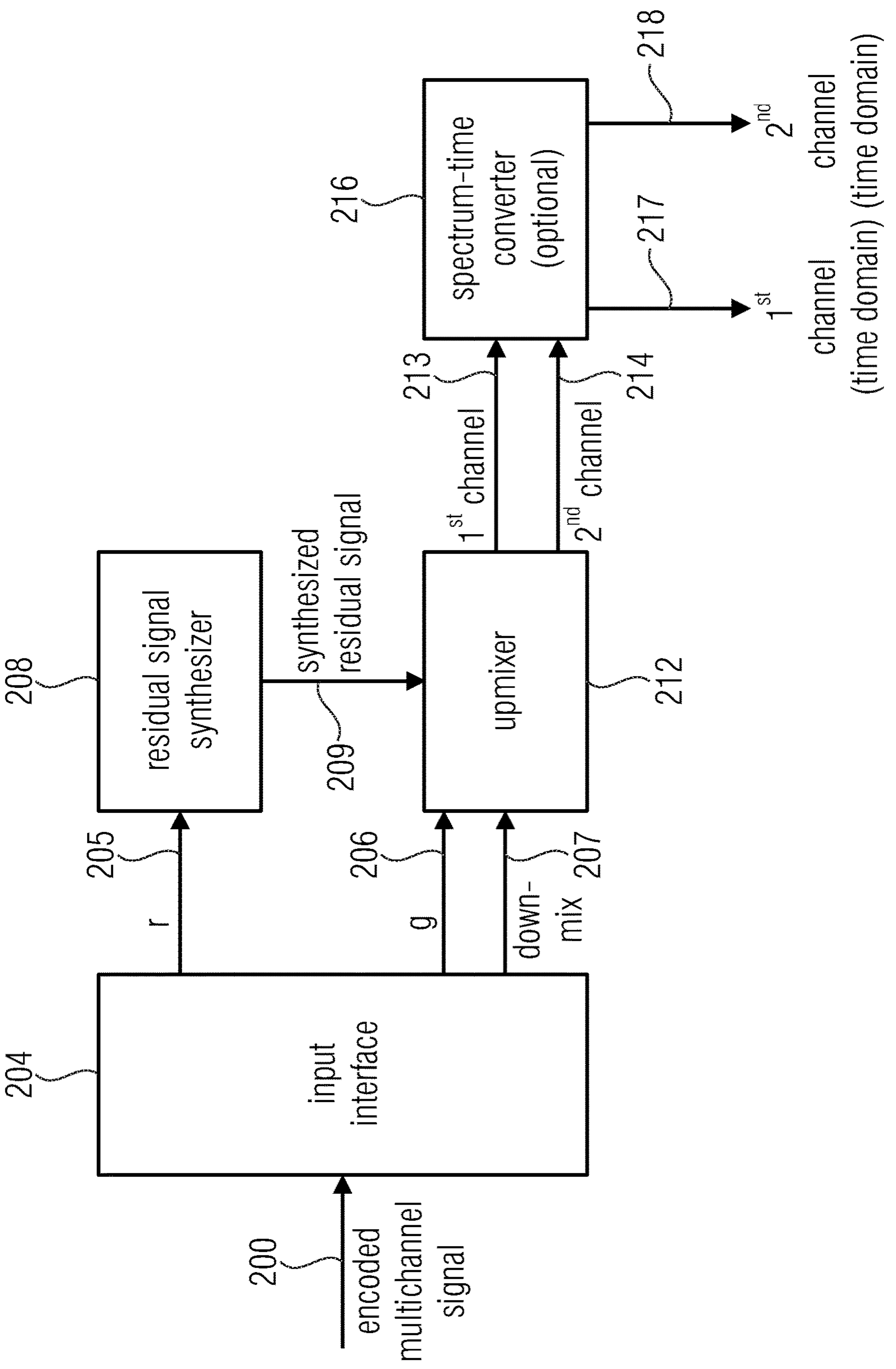
FIG. 6 is an embodiment of an apparatus for decoding an encoded multichannel signal.

FIG. 6 illustrates an apparatus for decoding an encoded multichannel signal 200. The apparatus for decoding comprises an input interface 204, a residual signal synthesizer 208 connected to the input interface 204 and an upmixer 212 connected to the input interface 204 on the one hand and the residual synthesizer 208 on the other hand. In an embodiment, the decoder additionally comprises a spectrum-time converter 260 in order to finally output time domain first and second channels as illustrated at 217 and 218.

In particular, the input interface 204 is configured for receiving the encoded multichannel signal 200 and for obtaining a downmix signal 207, a side gain g 206 and a residual gain r 205 from the encoded multichannel signal 200. The residual signal synthesizer 208 synthesizes a residual signal using the residual gain 205 and the upmixer 212 is configured for upmixing the downmix signal 207 using the side gain 206 and the residual signal 209 as determined by the residual signal synthesizer 208 to obtain a reconstructed first channel 213 and a reconstructed second channel 214. In the embodiment in which the residual signal synthesizer 208 and the upmixer 212 operate in the spectral domain or at least the upmixer 212 operates in the spectral domain, the reconstructed first and second channels 213, 214 are given in spectral domain representations and the spectral domain representation for each channel can be converted into the time domain by the spectrum-time converter 216 to finally output the time domain first and second reconstructed channels.

Figure 7:
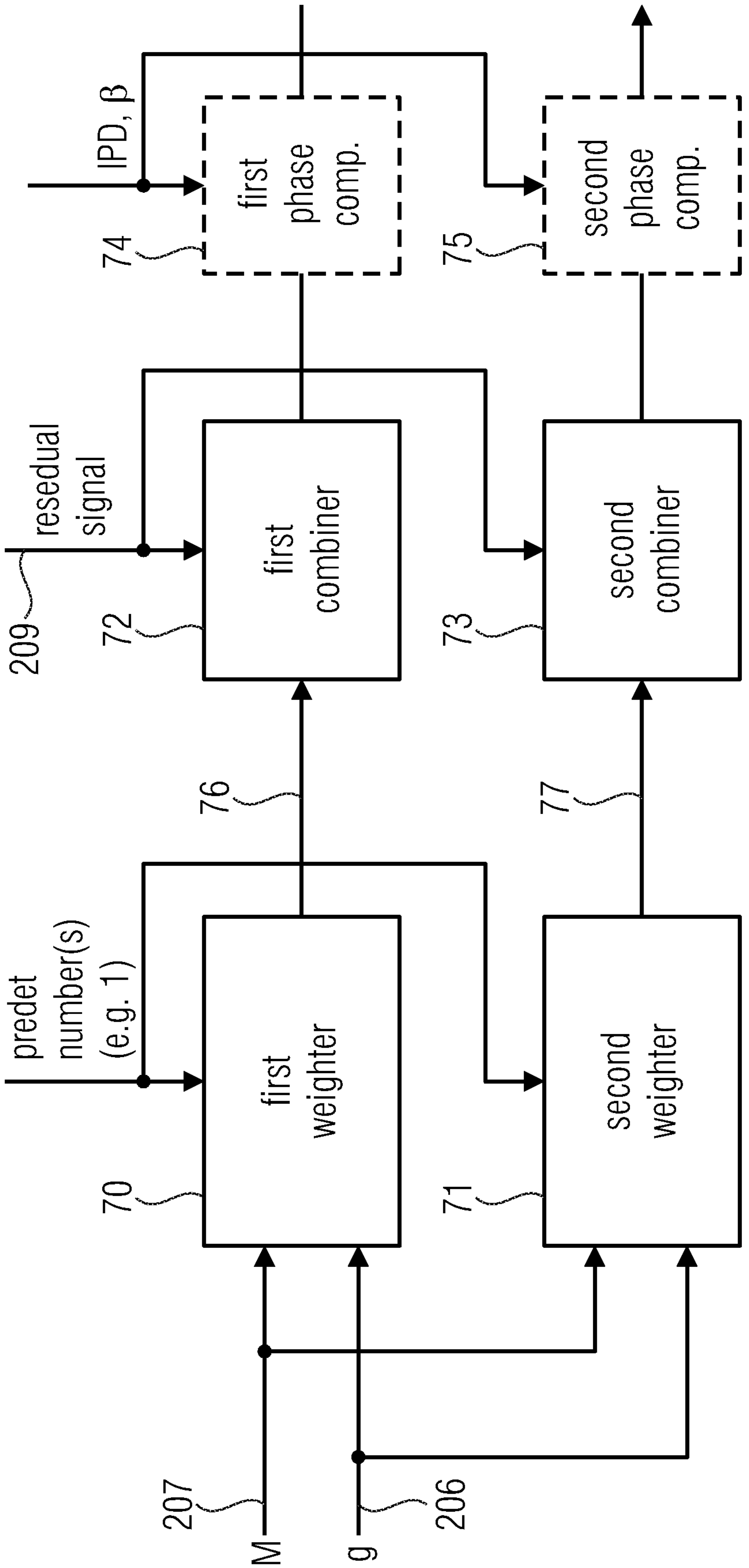
FIG. 7 is an embodiment of the upmixer.

In particular, the upmixer 212 is configured to perform a first weighting operation using a first weighter 70 illustrated in FIG. 7 to obtain a first weighted downmix channel. Furthermore, the upmixer performs a second weighting operation using a second weighter again using the side gain 206 on the one hand and the downmix signal 207 on the other hand to obtain a second weighted downmix signal. Advantageously, the first weighting operation performed by block 70 is different from the second weighting of operation performed by block 71 so that the first weighted downmix 76 is different from the second weighted downmix 77. Furthermore, the upmixer 212 is configured to calculate the reconstructed first channel using a combination performed by a first combiner 72 of the first weighted downmix signal 76 and the residual signal 209. Furthermore, the upmixer additionally comprises a second combiner 73 for performing a second combination of the second weighted downmix signal 77 and the residual signal 209.

The combination rules performed by the first combiner 72 and the second combiner 73 may be different from each other so that the output of block 72 on the one hand and block 73 on the other hand are substantially different to each other due to the different combining rules in block 72, 73 and due to the different weighting rules performed by block 70 and block 71.

The first and the second combination rules may be different from each other due to the fact that one combination rule is an adding operation and the other operation rule a subtracting operation. However, other pairs of first and second combination rules can be used as well.

Furthermore, the weighting rules used in block 70 and block 71 are different from each other, since one weighting rule uses a weighting with a weighting factor determined by a difference between a predetermined number and the side gain and the other weighting rule uses a weighting factor determined by a sum between a predetermined number and the side gain. The predetermined numbers can be equal to each other in both weighters or can be different from each other and the predetermined numbers are different from zero and can be integer or non-integer numbers and may be equal to 1.

Figure 8:
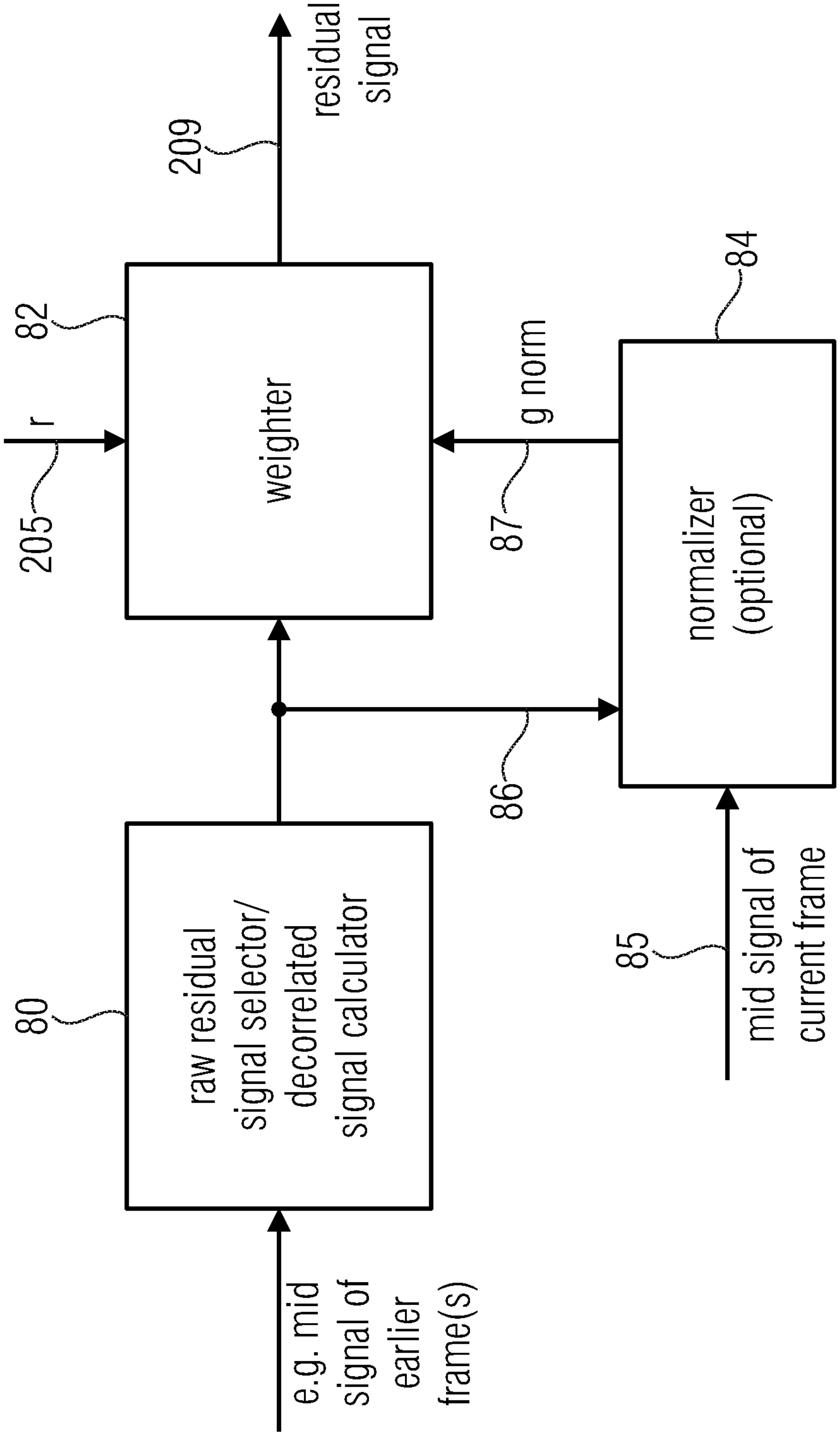
FIG. 8 is an embodiment of the residual signal synthesizer.

FIG. 8 illustrates an implementation of the residual signal synthesizer 208. The residual signal synthesizer 208 comprises a kind of raw residual signal selector or, generally, a decorrelated signal calculator 80. Furthermore, the signal output by block 80 is input into a weighter 82 that receives, as an input, the residual gain output by the input inter face 204 of FIG. 6 indicated with the reference numeral 205. Furthermore, the residual signal synthesizer may comprise a normalizer 84 that receives, as an input, a mid signal of the current frame 85 and, as a further input, the signal output by block 80, i.e., the raw signal or decorrelated signal 86. Based on those two signals, the normalization factor $g_{norm}$ 87 is calculated, where the normalization factor 87 may be used by the weighter 82 together with the residual gain r to finally obtain the synthesized residual signal 209.

In an embodiment, the raw residual signal selector 80 is configured for selecting a downmix signal of a preceding frame such as the immediately preceding frame or an even earlier frame. However, and depending on the implementation, the raw residual signal selector 80 is configured for selecting the left or right signal or first or second channel signal as calculated for a preceding frame or the raw residual signal selector 80 can also determine the residual signal based on, for example, a combination such as a sum, a difference or so of the left and right signal determined for either the immediately preceding frame or an even earlier preceding frame. In other embodiments, the decorrelated signal calculator 80 can also be configured to actually generate a decorrelated signal. However, it is of advantage that the raw residual signal selector 80 operates without a specific decorrelator such as a decorrelation filter such as reverberation filter, but, for low complexity reasons, only selects an already existing signal from the past such as the mid signal, the reconstructed left signal, the reconstructed right signal or a signal derived from the earlier reconstructed left and right signal by simple operations such as a weighted combination, i.e., a (weighted) addition, a (weighted) subtraction or so that does not rely on a specific reverberation or a decorrelation filter.

Generally, the weighter 82 is configured to calculate the residual signal so that an energy of the residual signal is equal to a signal energy indicated by the residual gain r, where this energy can be indicated in absolute terms, but may be indicated in relative terms with respect to the mid signal 207 of the current frame.

In the embodiments for the encoder side and the decoder side, values of the side gain and if appropriate from the residual gain are different from zero.

Subsequently, additional embodiments for the decoder are given in equation form.

The upmix is again done in frequency domain. To this end, the time-frequency transform from the encoder is applied to the decoded downmix yielding time-frequency vectors $\tilde{M}_{t,b}$. Using the dequantized values $\tilde{IPD}_{t,b}\tilde{g}_{t,b}$, and $\tilde{r}_{t,b}$, left and right channel are calculated as $$\tilde{L}_{t,k} = \frac{e^{i\tilde{\mathcal{B}}}\left(\tilde{M}_{t,k}(1+\tilde{g}_{t,b}) + \tilde{r}_{t,b} g_{norm} \tilde{\rho}_{t,k}\right)}{\sqrt{2}} \tag{17}$$

and $$\tilde{R}_{t,k} = \frac{e^{i\left(\tilde{\mathcal{B}}-I\tilde{P}D_b\right)}\left(\tilde{M}_{t,k}(1-\tilde{g}_{t,b}) - \tilde{r}_{t,b} g_{norm} \tilde{\rho}_{t,k}\right)}{\sqrt{2}} \tag{18}$$

for $k \in I_b$, where $\tilde{\rho}_{t,k}$ is a substitute for the missing residual $\rho_{t,k}$ from the encoder, and $g_{norm}$ is the energy adjusting factor $$\sqrt{\frac{E_{\tilde{M},t,b}}{E_{\tilde{\rho},t,b}}} \tag{19}$$

that turns the relative gain coefficient $\tilde{r}_{t,b}$ into an absolute one. One may for instance take $$\tilde{\rho}_{t,k} = \tilde{M}_{t-d_b,k}, \tag{20}$$

where $d_b > 0$ denotes a band-wise frame-delay. The phase rotation factor $\tilde{\beta}$ is calculated again as $$\tilde{\beta} = \mathrm{atan2}\left(\sin\left(I\tilde{P}D_{t,b}\right), \cos\left(I\tilde{P}D_{t,b}\right) + 2\frac{1+\tilde{g}_{t,b}}{1-\tilde{g}_{t,b}}\right) \tag{21}$$

The left channel and the right channel are then generated by applying the inverse DFT to $\tilde{L}_t$ and $\tilde{R}_t$ followed by a synthesis window and overlap add.

Figure 9:
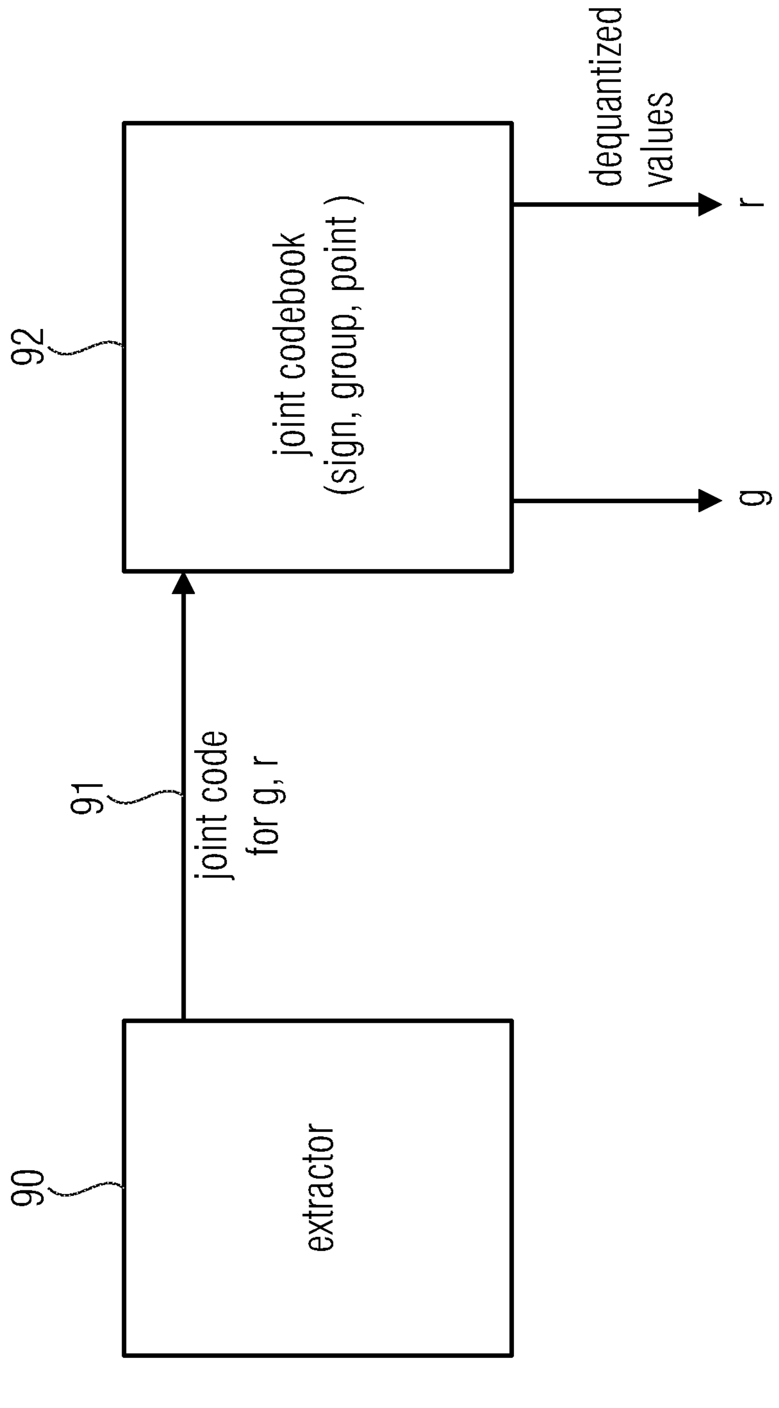
FIG. 9 is an embodiment for the input interface.

FIG. 9 illustrates a further embodiment of the input interface 204. This embodiment reflects the dequantization operation as discussed before for the encoder-side with respect to FIGS. 5*a* and 5*b*. Particularly, the input interface 204 comprises an extractor 90 extracting a joint code from the encoded multichannel signal. This joint code 91 is forwarded to a joint codebook 92 that is configured to output, for each code, a sign information, a group information or a point information or to output, for each code, the final dequantized value g and the final dequantized value r, i.e., the dequantized side and residual gains.

Figure 10A:
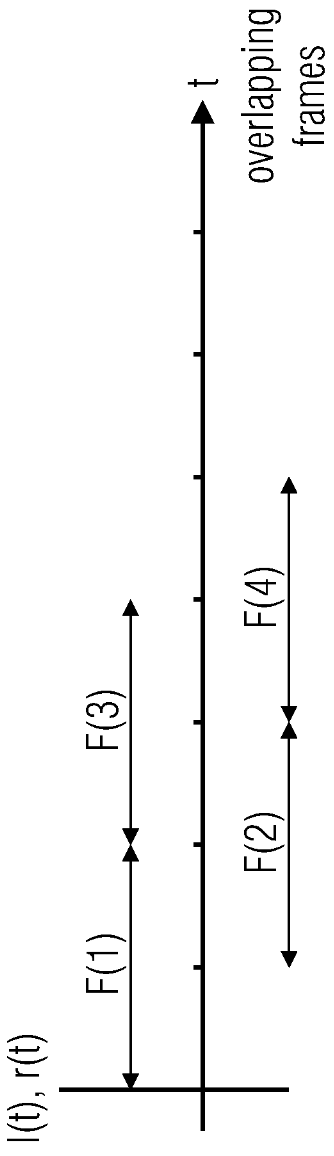
FIG. 10*a* illustrates the processing of overlapping frames.

FIG. 10*a* illustrates a schematic representation of a time domain first and second channel or left and right channel l(t) and r(t).

In the embodiment, in which the side gain and the residual gain are calculated in the spectral domain, the left and right channels or first and second channels are separated into advantageously overlapping frames F(1), F(2), F(3) and F(4) and so on. In the embodiment illustrated in FIG. 10*a*, the frames are overlapping by 50%, but other overlaps are useful as well. Furthermore, only a two-frame overlap is shown, i.e., that only two subsequent frames overlap with each other. However, multi-overlap frames can be used as well, such as three, four or five overlapping frames. Then, the advance value, i.e., how much the following frame is different from the current frame is not 50% as in the embodiment illustrated in FIG. 10*a*, but is only smaller such as 10%, 20% or 30% or so.

Figure 10B:
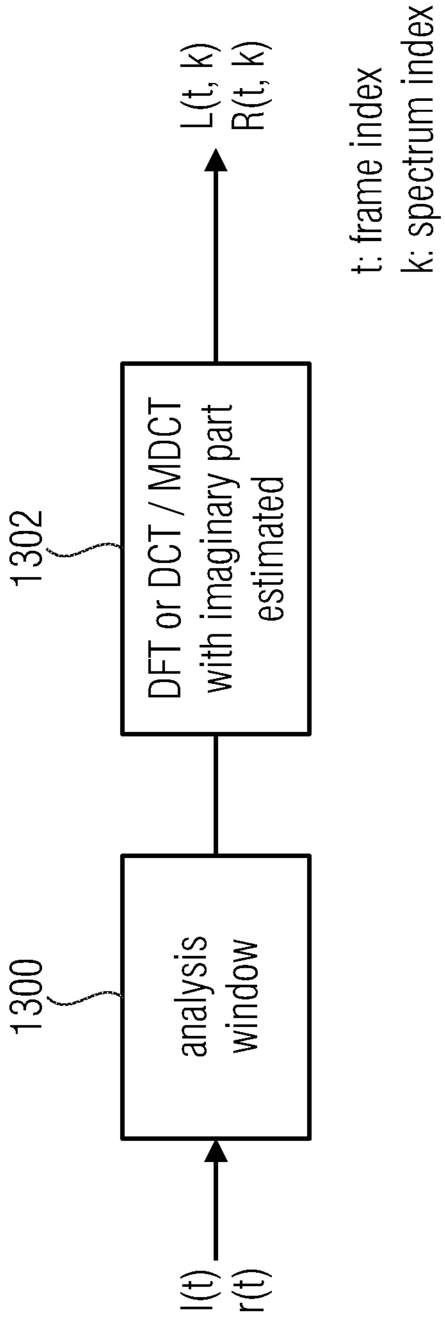
FIG. 10*b* illustrates an embodiment of the time-spectrum converter.

FIG. 10*b* illustrates an implementation of a time-spectral converter such as block 21 or block 22 illustrated in FIG. 2. Such a time-frequency converter receives, as an input, the sequence of frames l(t) or r(t). The analysis windower 1300 then outputs a sequence of windowed frames that all have been windowed with advantageously the same analysis window. Analysis windows can be sine windows or any other windows and a separate sequence is calculated for the first channel and a further separate sequence is calculated for the second channel.

Then, the sequences of windowed frames are input into a transform block 1302. The transform block 1302 may perform a transform algorithm resulting in complex spectral values such as a DFT and, specifically, an FFT. In other embodiments, however, also a purely real transform algorithm such as a DCT or an MDCT (modified discrete cosine transform) can be used as well and, subsequently, the imaginary parts can be estimated from the purely real parts as is known in the art and as is, for example, implemented in the USAC (unified speech and audio coding) standard. Other transform algorithms can be sub-band filter banks such as QMF filter banks that result in complex-valued subband signals. Typically, subband signal filter bands have a lower frequency resolution than FFT algorithms and an FFT or DFT spectrum having a certain number of DFT bins can be transformed into a sub-band-wise representation by collecting certain bins. This is illustrated in FIG. 10*c*.

Figure 10C:
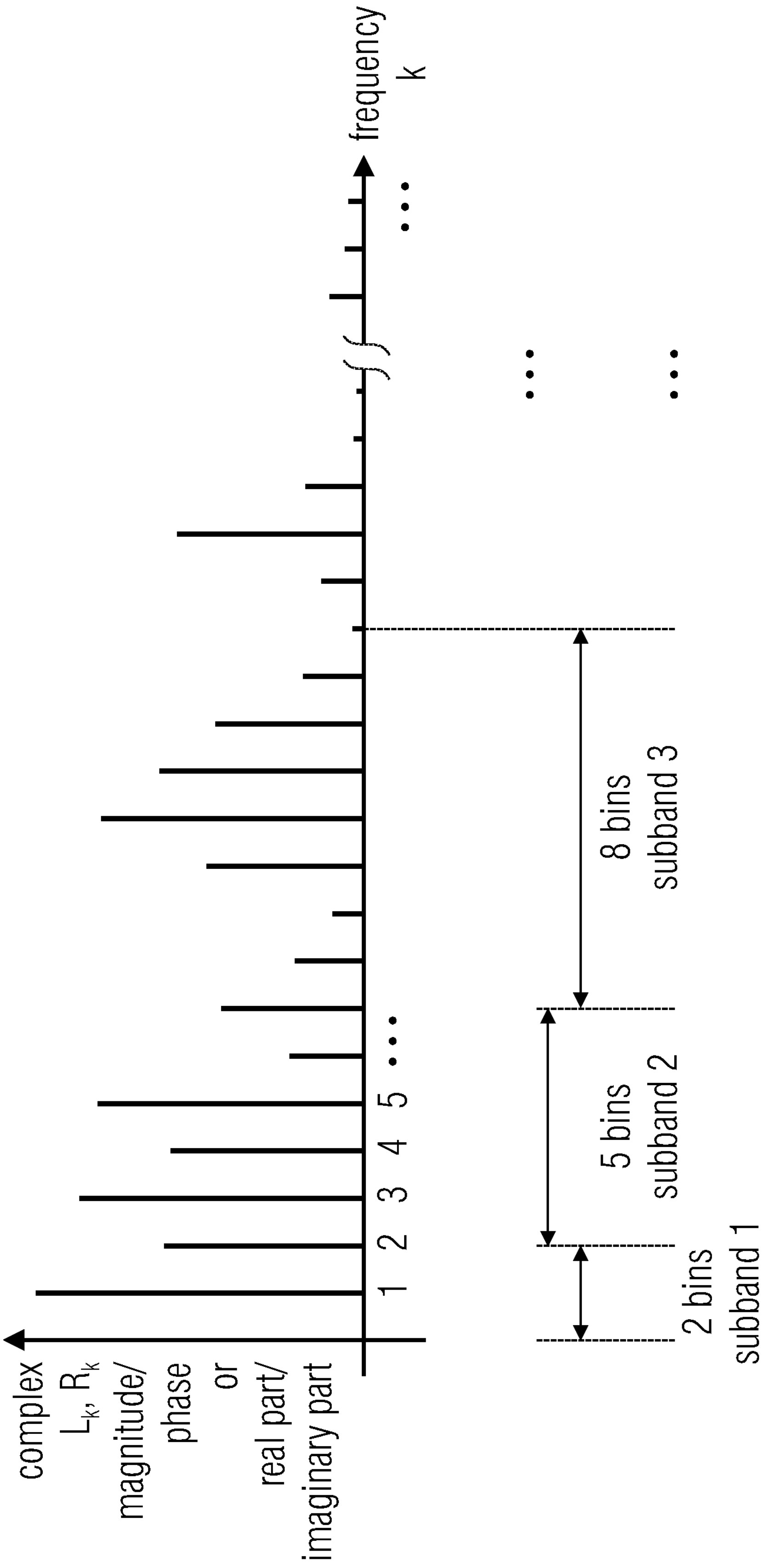
FIG. 10*c* illustrates a spectrum of a left channel or a right channel and a construction of different subbands.

Particularly, FIG. 10*c* illustrates a complex spectrum of the frequency domain representation of the first or the second channel $L_k$, $R_k$ for a specific frame t. The spectral values are given in a magnitude/phase representation or in the real part/imaginary part representation. Typically, the DFT results in frequency bins having the same frequency resolution or bandwidth. Advantageously, however, the side and residual gains are calculated subband-wise in order to reduce the number of bits for transmitting the residual and side gains. The subband representation may be generated using subbands that increase from lower to higher frequencies. Thus, in an example, subband 1 can have a first number of frequency bins such as two bins, and a second higher subband such as subband 2, subband 3, or any other subband can have a higher number of frequency bins such as, for example, eight frequency bins as illustrated by subband 3. Thus, the frequency bandwidth of the individual subbands can be advantageously adjusted to the characteristics of the human ear as is known in the art with respect to the Bark scale.

Thus, FIG. 10*c* illustrates different frequency bins indicated by parameters kin the equations disclosed before, and the individual subbands illustrated in FIG. 10*c* are indicated by subband index b.

Figure 10D:
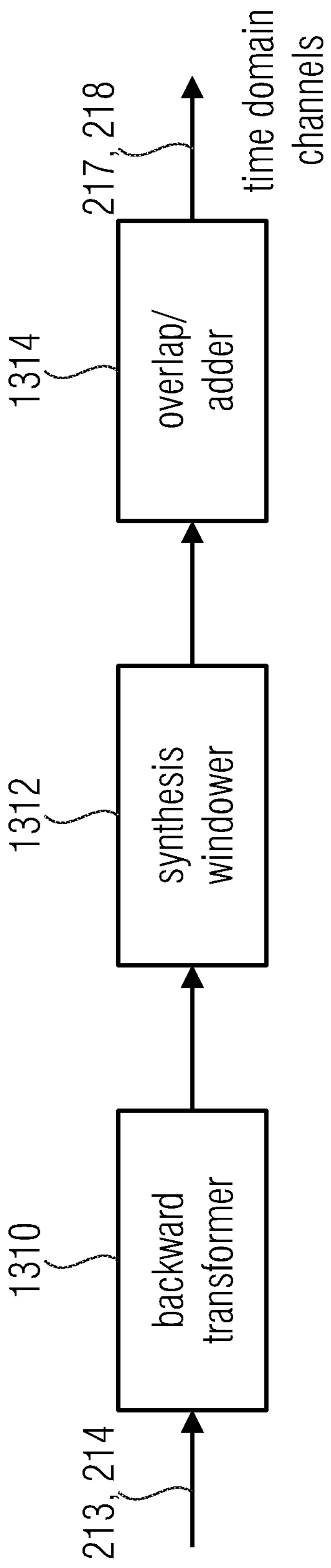
FIG. 10*d* illustrates an embodiment for a spectrum-time converter.

FIG. 10*d* illustrates an implementation of a spectrum-to-time converter as is, for example, implemented by block 216 in FIG. 6. The spectrum-time converter uses a backward transformer 1310, a subsequently connected synthesis windower 1312 and a subsequently connected overlap/adder 1314 to finally obtain the time domain channels. Thus, at the input into 1310 are the reconstructed spectral domain channels 213, 214 illustrated in FIG. 6, and at the output of the overlap/adder 1340, there exist the time domain reconstructed first and second channels 217, 218.

The backward transformer 1310 is configured to perform an algorithm resulting in a backward transform and, particularly, an algorithm that may be inverse to the algorithm applied in block 1302 of FIG. 10*b* on the encoder-side. Furthermore, the synthesis window 1312 is configured to apply a synthesis window that is matched with a corresponding analysis window and, advantageously, the same analysis and synthesis windows are used, but this is not necessarily the case. The overlap adder 1314 is configured to perform an overlap as illustrated in FIG. 10*a*. Thus, the overlap/adder 1314, for example, takes the synthesis windowed frame corresponding to F(3) of FIG. 10*a* and additionally takes the synthesis windowed frame F(4) of FIG. 10*a* and then adds the corresponding samples of the second half of F(3) to the corresponding samples of the first half of F(4) in a sample-by-sample manner to finally obtain the samples of an actual time domain output channel.

Subsequently, different specific aspects of the present invention are given in short.

- Stereo M/S with IPD compensation and absolute phase compensation according to equation (4).
- Stereo M/S with IPD compensation and prediction of S by M according to (10)
- Stereo M/S with IPD compensation, prediction of S by M according to (9) and residual prediction according to gain factor (10)
- Efficient quantization of side and residual gain factors through joint quantization
- Joint quantization of side and residual gain factors on lines corresponding to a fixed energy ratio of $L_t$ and $R_t$ in the (g, r)-plane.

It is to be noted that, advantageously, all of the above referenced five different aspects are implemented in one and the same encoder/decoder framework. However, it is additionally to be noted that the individual aspects given before can also be implemented separately from each other. Thus, the first aspect with the IPD compensation and absolute phase compensation can be performed in any downmixer irrespective of any side gain/residual gain calculation. Furthermore, for example, the aspect of the side gain calculation and the residual gain calculation can be performed with any downmix, i.e., also with a downmix that is not calculated by a certain phase compensation.

Furthermore, even the calculation of the side gain on the one hand and the residual gain on the other hand can be performed independent from each other, where the calculation of the side gain alone or together with any other parameter different from the residual gain is also advantageous over the art particularly, with respect to an ICC or ILD calculation and, even the calculation of the residual gain alone or together with any other parameter different from the side gain is also already useful.

Furthermore, the efficient joint or conditional quantization of the side and the residual gains or gain factors is useful with any particular downmix. Thus, the efficient quantization can also be used without any downmix at all. And, this efficient quantization can also be applied to any other parameters where the second parameter depends, with respect to its value range, from the first parameter so that a very efficient and low complex quantization can be performed for such dependent parameters that can, of course, be parameters different from the side gain and residual gain as well.

Thus, all of the above mentioned five aspects can be performed and implemented independent from each other or together in a certain encoder/decoder implementation, and, also, only a subgroup of the aspects can be implemented together, i.e., three aspects are implemented together without the other two aspects or only two out of the five aspects are implemented together without the other three aspects as the case may be.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

MPEG-4 High Efficiency Advanced Audio Coding (HE-AAC) v2

FROM JOINT STEREO TO SPATIAL AUDIO CODING—RECENT PROGRESS AND STANDARDIZATION, Proc. of the 7th Int. Conference on digital Audio Effects (DAFX-04), Naples, Italy, Oct. 5-8, 2004.

The invention claimed is:

1. An apparatus for encoding a multi-channel audio signal comprising at least two audio channels, comprising:

a downmixer for calculating a downmix signal from the multi-channel audio signal;

a parameter calculator for calculating a side gain from a first audio channel of the at least two audio channels and a second audio channel of the at least two audio channels and for calculating a residual gain from the first audio channel and the second audio channel; and an output interface for generating an output signal, the output signal comprising information on the downmix signal, and on the side gain and the residual gain, wherein the parameter calculator is configured:

to generate a sub-bandwise representation of the first audio channel and the second audio channel, to calculate a first amplitude-related characteristic of the first audio channel in a sub-band and to calculate a second amplitude-related characteristic of the second audio channel in the sub-band, to calculate an inner product of the first audio channel and the second audio channel in the sub-band;

to calculate the side gain in the sub-band using a first relation involving the first amplitude-related characteristic, the second amplitude-related characteristic, and the inner product; and to calculate the residual gain in the sub-band using a second relation involving the first amplitude-related characteristic, the second amplitude-related characteristic, and the inner product, the second relation being different from the first relation, wherein the first and second amplitude-related characteristics are determined from corresponding amplitudes, from corresponding powers, from corresponding energies or from any powers of corresponding amplitudes with an exponent greater than 1, or wherein the parameter calculator is configured to calculate the side gain as a side prediction gain that is applicable to a mid signal of the first and the second audio channels to predict a side signal of the first and the second audio channels, and to calculate the residual gain as a residual prediction gain indicating an amplitude-related characteristic of a residual signal of the prediction of the side signal by the mid signal using the side gain.

2. The apparatus of claim 1, wherein the parameter calculator is configured to calculate, for each sub-band of a plurality of sub-bands of the first audio channel and the second audio channel, the side gain and the residual gain.

3. The apparatus of claim 1, wherein the parameter calculator is configured to calculate the side gain using the first relation comprising a first fraction comprising a first nominator and a first denominator, the first nominator involving the first amplitude-related characteristic of the first audio channel and the second amplitude-related characteristic of the second audio channel, and the first denominator involving the first amplitude-related characteristic of the first audio channel and the second amplitude-related characteristic of the second audio channel and the inner product, and wherein the parameter calculator is configured to calculate the residual gain using the second relation comprising a second fraction comprising a second nominator and a second denominator, the second nominator involving the inner product, and the second denominator involving the inner product.

4. The apparatus of claim 3, wherein the first nominator comprises a difference of the first amplitude-related characteristic of the first audio channel and the second amplitude-related characteristic of the second audio channel, and wherein the first denominator comprises a sum of the first amplitude-related characteristic of the first audio channel and the second amplitude-related characteristic of the second audio channel and a value derived from the inner product, and wherein the second nominator comprises a difference between a weighted sum of the first amplitude-related characteristic of the first audio channel and the second amplitude-related characteristic of the second audio channel and the inner product, and wherein the second denominator comprises the sum of the amplitude-related characteristic of the first audio channel, the amplitude-related characteristic of the second audio channel and a value derived from the inner product.

5. The apparatus of claim 1, wherein the parameter calculator is configured to calculate the side gain for a sub-band and to calculate the residual gain for the sub-band using the side gain for the sub-band.

6. The apparatus of claim 1, wherein the parameter calculator is configured to calculate the side gain so that values for the side gain are in a range of ±20% of values determined based on the following equation:

$$g_{t,b} = \frac{E_{L,t,b} - E_{R,t,b}}{E_{L,t,b} + E_{R,t,b} + 2X_{L/R,t,b}},$$

and wherein the parameter calculator is configured to calculate the residual gain so that values for the residual gain are in a range of ±20% of values determined based on the following equation:

$$r_{t,b} = \left(\frac{(1 - g_{t,b})E_{L,t,b} + (1 + g_{t,b})E_{R,t,b} - 2X_{L/R,t,b}}{E_{L,t,b} + E_{R,t,b} + 2X_{L/R,t,b}}\right)^{1/2},$$

wherein t is a frame index, wherein b is a sub-band index, wherein $E_L$ is an energy of the first audio channel as the first amplitude related characteristic in the frame and the sub-band, wherein $E_R$ is an energy of the second audio channel as the second amplitude related characteristic in the frame t and the sub-band b, and wherein X is an absolute value of the inner product between the first audio channel and the second audio channel in the frame t and the sub-band b.

7. The apparatus of claim 1, wherein the parameter calculator is configured to calculate a sub-band-wise representation of the first audio channel and the second audio channel as a sequence of complex valued spectra, wherein each spectrum is related to a time frame of the first or the second audio channel, wherein the time frames related to the sequence of complex valued spectra are adjacent in the sequence of complex valued spectra and overlap with each other, or wherein the parameter calculator is configured to calculate the first amplitude-related measure and the second amplitude-related measure by squaring magnitudes of complex spectral values in a sub-band and by summing squared magnitudes in the sub-band, or wherein the parameter calculator is configured to calculate an inner product by summing, in the sub-band, products, wherein each product involves a spectral value in a frequency bin of the first audio channel and a conjugate complex spectral value of the second audio channel for the frequency bin, and by forming a magnitude of a result of the summing.

8. The apparatus of claim 1, wherein the output interface comprises a waveform encoder configured to waveform encode the downmix signal to acquire the information on the downmix signal.

9. The apparatus of claim 1, wherein the parameter calculator is configured to calculate the side gain and the residual gain so that the residual gain depends on the side gain, and wherein the output interface is configured to quantize the side gain and to then quantize the residual gain, wherein a quantization step for the residual gain depends on the value of the side gain.

10. The apparatus of claim 1, wherein the parameter calculator is configured to calculate the side gain and the residual gain so that the residual gain depends on the side gain, and wherein the output interface is configured to perform a joint quantization using groups of quantization points, each group of quantization points being defined by fixed amplitude-related ratio between the first audio channel and the second audio channel.

11. The apparatus of claim 10, wherein the parameter calculator is configured to calculate the side gain so that the side gain comprises a value range between −1 and +1, and wherein the output interface is configured to use a code comprising a sign bit and comprising side gain values being only positive or being only negative.

12. The apparatus of claim 10, wherein the output interface is configured:

to calculate an inter-channel level difference between the first audio channel and the second audio channel, to identify the group of quantization points matching with the inter-channel level difference, to only search within the identified group; and to combine a sign bit, an identification of the group and an identification of the point within the identified group to acquire a code word representing the quantized side gain and the quantized residual gain.

13. The apparatus of claim 10, wherein a code book used by the output interface comprises a code table with a multitude of entries, each entry being identified by binary code word, each binary code word comprising a sign bit, a first group of bits identifying the group of quantization points, and a second group of bits identifying a quantization point within the group of quantization points.

14. The apparatus of claim 10, wherein a code book used by the output interface comprises 16 groups of quantization points, 8 quantization points per group, and wherein a code word of the code book is an 8-bit code word with a single sign bit and a group of 4 bits identifying a group among the 16 groups and a group of 3 bits identifying a quantization point within an identified group of quantization points.

15. The apparatus of claim 1, wherein the parameter calculator is configured:

to calculate a side signal from the first audio channel and the second audio channel;

to determine a plurality of residual gains from differences between the side signal and the downmix signal weighted by a plurality of different test side gains;

to select a specific test side gain of the plurality of different test side gains as the side gain, for which the residual signal fulfils a predefined condition; and to calculate the residual gain from a specific residual signal determined with the specific test side gain.

16. The apparatus of claim 15, wherein the residual gain is determined from an energy of the specific residual signal and an energy of the downmix signal or an energy of a sum of the first audio channel and the second audio channel.

17. A method of encoding a multi-channel audio signal comprising at least two audio channels, comprising:

calculating a downmix signal from the multi-channel audio signal;

calculating a side gain from a first audio channel of the at least two audio channels and a second audio channel of the at least two audio channels and calculating a residual gain from the first audio channel and the second audio channel; and generating an output signal, the output signal comprising information on the downmix signal, and on the side gain and the residual gain, wherein the calculating the side gain and the residual gain comprises:

generating a sub-bandwise representation of the first audio channel and the second audio channel, calculating a first amplitude-related characteristic of the first audio channel in a sub-band and to calculate a second amplitude-related characteristic of the second audio channel in the sub-band, calculating an inner product of the first audio channel and the second audio channel in the sub-band;

calculating the side gain in the sub-band using a first relation involving the first amplitude-related characteristic, the second amplitude-related characteristic, and the inner product; and calculating the residual gain in the sub-band using a second relation involving the first amplitude-related characteristic, the second amplitude-related characteristic, and the inner product, the second relation being different from the first relation, wherein the first and second amplitude-related characteristics are determined from corresponding amplitudes, from corresponding powers, from corresponding energies or from any powers of corresponding amplitudes with an exponent greater than 1, or wherein the calculating the side gain and the residual gain comprises calculating the side gain as a side prediction gain that is applicable to a mid signal of the first and the second audio channels to predict a side signal of the first and the second audio channels, and calculating the residual gain as a residual prediction gain indicating an amplitude-related characteristic of a residual signal of the prediction of the side signal by the mid signal using the side gain.

18. A non-transitory digital storage medium having stored thereon a computer program for performing, when said computer program is run by a computer, a method of encoding a multi-channel audio signal comprising at least two audio channels, comprising:

calculating a downmix signal from the multi-channel audio signal;

calculating a side gain from a first audio channel of the at least two audio channels and a second audio channel of the at least two audio channels and calculating a residual gain from the first audio channel and the second audio channel; and generating an output signal, the output signal comprising information on the downmix signal, and on the side gain and the residual gain, wherein the calculating the side gain and the residual gain comprises:

generating a sub-bandwise representation of the first audio channel and the second audio channel, calculating a first amplitude-related characteristic of the first audio channel in a sub-band and to calculate a second amplitude-related characteristic of the second audio channel in the sub-band, calculating an inner product of the first audio channel and the second audio channel in the sub-band;

calculating the side gain in the sub-band using a first relation involving the first amplitude-related characteristic, the second amplitude-related characteristic, and the inner product; and calculating the residual gain in the sub-band using a second relation involving the first amplitude-related characteristic, the second amplitude-related characteristic, and the inner product, the second relation being different from the first relation, wherein the first and second amplitude-related characteristics are determined from corresponding amplitudes, from corresponding powers, from corresponding energies or from any powers of corresponding amplitudes with an exponent greater than 1, or wherein the calculating the side gain and the residual gain comprises calculating the side gain as a side prediction gain that is applicable to a mid signal of the first and the second audio channels to predict a side signal of the first and the second audio channels, and calculating the residual gain as a residual prediction gain indicating an amplitude-related characteristic of a residual signal of the prediction of the side signal by the mid signal using the side gain.

* * * * *